United States Patent
Segi et al.

(10) Patent No.: US 12,439,604 B2
(45) Date of Patent: Oct. 7, 2025

(54) SEMICONDUCTOR DEVICE AND METHOD OF MANUFACTURING THE SAME

(71) Applicant: RENESAS ELECTRONICS CORPORATION, Tokyo (JP)

(72) Inventors: Kazuhiko Segi, Tokyo (JP); Yoshiyuki Kawashima, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 378 days.

(21) Appl. No.: 18/303,909

(22) Filed: Apr. 20, 2023

(65) Prior Publication Data

US 2023/0413568 A1 Dec. 21, 2023

(30) Foreign Application Priority Data

Jun. 17, 2022 (JP) .................. 2022-097814

(51) Int. Cl.
*H10B 43/35* (2023.01)
*H10B 43/40* (2023.01)

(52) U.S. Cl.
CPC ............. *H10B 43/35* (2023.02); *H10B 43/40* (2023.02)

(58) Field of Classification Search
None
See application file for complete search history.

(56) References Cited

U.S. PATENT DOCUMENTS

| | | | |
|---|---|---|---|
| 11,145,744 B2 | 10/2021 | Abe et al. | |
| 2017/0047337 A1* | 2/2017 | Takekida | H10B 41/35 |
| 2018/0286881 A1* | 10/2018 | Yamakoshi | H10D 30/69 |
| 2018/0366556 A1* | 12/2018 | Abe | H10D 30/0275 |
| 2021/0226013 A1* | 7/2021 | Goto | H10B 43/10 |
| 2022/0077286 A1* | 3/2022 | Shioda | H10D 30/797 |

FOREIGN PATENT DOCUMENTS

JP 2019-004103 A 1/2019

* cited by examiner

*Primary Examiner* — Alexander G Ghyka
(74) *Attorney, Agent, or Firm* — Rimon P.C.

(57) ABSTRACT

In a memory region, a memory-region first portion in which no raised epitaxial layer is formed, a memory-region second portion in which a first raised epitaxial layer is formed, and a memory-region third portion in which a second raised epitaxial layer is formed are defined. In the memory-region first portion, a first-diffusion-layer first portion of a memory transistor and a second-diffusion-layer first portion of a select transistor are formed. A first-diffusion-layer second portion of the memory transistor is formed in the first raised epitaxial layer. A second-diffusion-layer second portion of the select transistor is formed in the second raised epitaxial layer.

15 Claims, 34 Drawing Sheets

SEMICONDUCTOR DEVICE AND METHOD OF MANUFACTURING THE SAME

CROSS-REFERENCE TO RELATED APPLICATIONS

The disclosure of Japanese Patent Application No. 2022-097814 filed on Jun. 17, 2022, including the specification, drawings and abstract is incorporated herein by reference in its entirety.

BACKGROUND

The present disclosure relates to a semiconductor device and a method of manufacturing the same, and can be suitably used, for example, in a semiconductor device including a nonvolatile memory having a charge storage layer.

Here, there are disclosed techniques listed below.
[Patent Document 1] Japanese Unexamined Patent Application Publication No. 2019-4103

A flash memory is widely used as the nonvolatile memory capable of electrical writing and erasing an information. Patent Document 1 discloses a semiconductor device including a flash memory.

In a memory region of the flash memory, a plurality of memory cells is arranged. In one memory cell, for example as shown in FIG. 20 of Patent Document 1, a memory transistor and a select transistor are electrically coupled in series. A bit line is electrically coupled to the memory transistor. A source line is electrically coupled to the select transistor.

The memory transistor includes a memory gate electrode and a pair of diffusion layers. The memory gate electrode is formed on a surface of a semiconductor substrate located between the pair of diffusing layers via a charge storage layer. The charge (electron) as an information is accumulated in the charge storage layer.

In the memory transistor, in order to suppress the drain disturbance, the pair of diffusion layers is formed in a region including a "raised epitaxial layer" epitaxially grown from the surface of the semiconductor substrate. Note that the drain disturbance is a phenomenon in which an information of a memory transistor of an unselected bit that is not selected is erroneously erased during an operation of writing an information to a memory transistor of a selected bit.

The raised epitaxial layer is formed on the surface of the semiconductor substrate to which the bit line is to be connected with respect to the memory transistor. In addition, the raised epitaxial layer is formed on the surface of the semiconductor substrate to which the source line is to be connected with respect to the select transistor. Further, the raised epitaxial layer is formed on the surface of the semiconductor substrate located between the memory transistor and the select transistor.

In a read operation of an operation of the semiconductor device, a predetermined voltage for performing the read operation is applied to each of the memory gate electrode, a select gate electrode, the source line, the bit line, and the region of the semiconductor substrate. At this time, the judgement whether or not the information is accumulated performed depending on whether a current higher than a reference current flows or a current lower than the reference current flows from the source line toward the bit line.

When the electron is injected into the charge storage layer of the memory transistor, the threshold voltage of the memory transistor becomes higher than the reference potential. In this case, a current lower than the reference current flows from the source line toward the bit line via each of the select transistor and the memory transistor. That is, as for the selected bit, when a current lower than the reference current flows from the source line toward the bit line, the selected bit is determined as a written cell in which the information has been written.

On the other hand, when the electron is not injected into the charge storage layer of the memory transistor, the threshold voltage of the memory transistor becomes lower than the reference potential. In this case, a current higher than the reference current flows from the source line toward the bit line via each of the select transistor and the memory transistor. That is, as for the selected bit, when a current higher than the reference current flows from the source line toward the bit line, the selected bit is determined as an erased cell in which no information has been written.

SUMMARY

In the semiconductor device described above, the raised epitaxial layer is formed not only on the surface of the semiconductor substrate to which the bit line is to be connected to the memory transistor as well as on the surface of the semiconductor substrate to which the source line is to be connected to the select transistor, but also on the surface of the semiconductor substrate located between the memory transistor and the select transistor. A diffusion layer of a memory transistor and a diffusion layer of a select transistor are formed in a region including the raised epitaxial layer formed between the memory transistor and the select transistor.

The region including the diffusion layer is formed by implanting, for example, an n-type impurity from the surface of the raised epitaxial layer. As a result, an impurity concentration decreases as it goes from the surface of the raised epitaxial layer to the semiconductor substrate.

Therefore, for example in the read operation of the flash memory, the resistance value of the semiconductor substrate, which is a path between the memory transistor and the select transistor, in paths through which the current (electron) flows, respectively, increases, and the current hardly flows from the source line toward the bit line. Then, a current lower than the reference current may flow, and the selected bit may be erroneously determined as the write cell even though it is originally the erased cell.

Other objects and novel features will become apparent from the description of this specification and the accompanying drawings.

A semiconductor device according to one embodiment is a semiconductor device including a semiconductor element including a memory transistor and a select transistor, and also includes a semiconductor substrate, an element region defined in the semiconductor substrate and the semiconductor element formed in the element region. The semiconductor substrate includes a semiconductor-supporting substrate. The element region includes a first element region defined in the semiconductor-supporting substrate. The semiconductor element includes the memory transistor and the select transistor that are electrically coupled in series and that are formed in the first element region so as to be spaced apart from each other. The memory transistor has a memory-gate insulating film, a memory gate electrode and a first impurity region. The memory-gate insulating film is formed on a surface of the semiconductor-supporting substrate located in the first element region and including a charge storage layer. The memory gate electrode is formed on the memory-gate insulating film. The first impurity region includes a first-impurity-region first portion and a first-impurity-region second portion. The select transistor has a select-gate insulating film, a select gate electrode and a second impurity region. The select-gate insulating film is formed on the surface of the semiconductor-supporting substrate located in the first element region. The select gate electrode is formed on the select-gate insulating film. The second impurity region includes a second-impurity-region first portion and a second-impurity-region second portion. The first element region includes a first-element-region first portion, a first-element-region second portion and a first-element-region third portion. The first-element-region first portion is defined in the semiconductor-supporting substrate located between the memory gate electrode and the select gate electrode. The first-element-region second portion is defined in the semiconductor-supporting substrate located at opposite side of the select gate electrode with respect to the memory gate electrode. The first-element-region third portion is defined in the semiconductor-supporting substrate located at opposite side of the memory gate electrode with respect to the select gate electrode. In the first-element-region second portion, a first raised portion is formed from the surface of the semiconductor-supporting substrate to a position higher than the surface. In the first-element-region third portion, a second raised portion is formed from the surface of the semiconductor-supporting substrate to a position higher than the surface. In the element region, a raised portion including the first raised portion and the second raised portion is formed. The raised portion is not formed in the first-element-region first portion, and each of the first-impurity-region first portion and the second-impurity-region first portion is formed in the first-element-region first portion in which the raised portion is not formed. The first-impurity-region second portion is formed in the first-element-region second portion so as to include the first raised portion. The second-impurity-region second portion is formed in the first-element-region third portion so as to include the second raised portion. Also, in each of the first-impurity-region first portion, the first-impurity-region second portion, the second-impurity-region first portion and the second-impurity-region second portion, an impurity concentration of a region close to a surface thereof is higher than an impurity concentration of a region far away from the surface thereof.

A method of manufacturing a semiconductor device according to another embodiment is a method of manufacturing a semiconductor device including a semiconductor element including a memory transistor and a select transistor, and also includes steps of: (a) providing a semiconductor substrate including a semiconductor-supporting substrate; (b) defining an element region in the semiconductor substrate; and (c) forming the semiconductor element in the element region. The step of (b) includes a step of defining a first element region in the semiconductor-supporting substrate. The step of (c) includes a step of forming each of the memory transistor having a memory gate electrode, a first-impurity-region first portion and a first-impurity-region second portion and the select transistor having a select gate electrode, a second-impurity-region first portion and a second-impurity-region second portion in the first element region. The step of forming each of the memory transistor and the select transistor includes: (c1) in the first element region, forming the memory gate electrode and the select gate electrode so as to be spaced apart from each other; (c2) in the first element region, forming a blocking film so as to cover a first-element-region first portion defined in the semiconductor-supporting substrate located between the memory gate electrode and the select gate electrode, the blocking film being a film for preventing an epitaxial growth; (c3) in a state that the blocking film is formed, by an epitaxial growth method, forming a first raised portion at a first-element-region second portion defined in the semiconductor-supporting substrate located at opposite side of the select gate electrode with respect to the memory gate electrode, the first raised portion being formed from a surface of the semiconductor-supporting substrate to a position higher than the surface, and forming a second raised portion at a first-element-region third portion defined in the semiconductor-supporting substrate located at opposite side of the memory gate electrode with respect to the select gate electrode, the second raised portion being formed from the surface of the semiconductor-supporting substrate to a position higher than the surface; and (c4) by implanting an impurity into each of the surface of the semiconductor-supporting substrate, a surface of the first raised portion and a surface of the second raised portion, forming each of the first-impurity-region first portion and the second-impurity-region first portion in the first-element-region first portion, forming the first-impurity-region second portion in the first-element-region second portion so as to include the first raised portion, and forming the second-impurity-region second portion in the first-element-region third portion so as to include the second raised portion.

According to the semiconductor device according to the one embodiment, it is possible to prevent an erase cell from being erroneously determined to be a write cell in "Read" operation.

According to the method of manufacturing the semiconductor device according to the another embodiment, it is possible to manufacture a semiconductor device capable of suppressing erroneous determination that a erase cell is a write cell in "Read" operation.

DETAILED DESCRIPTION

First Embodiment

Figure 1:
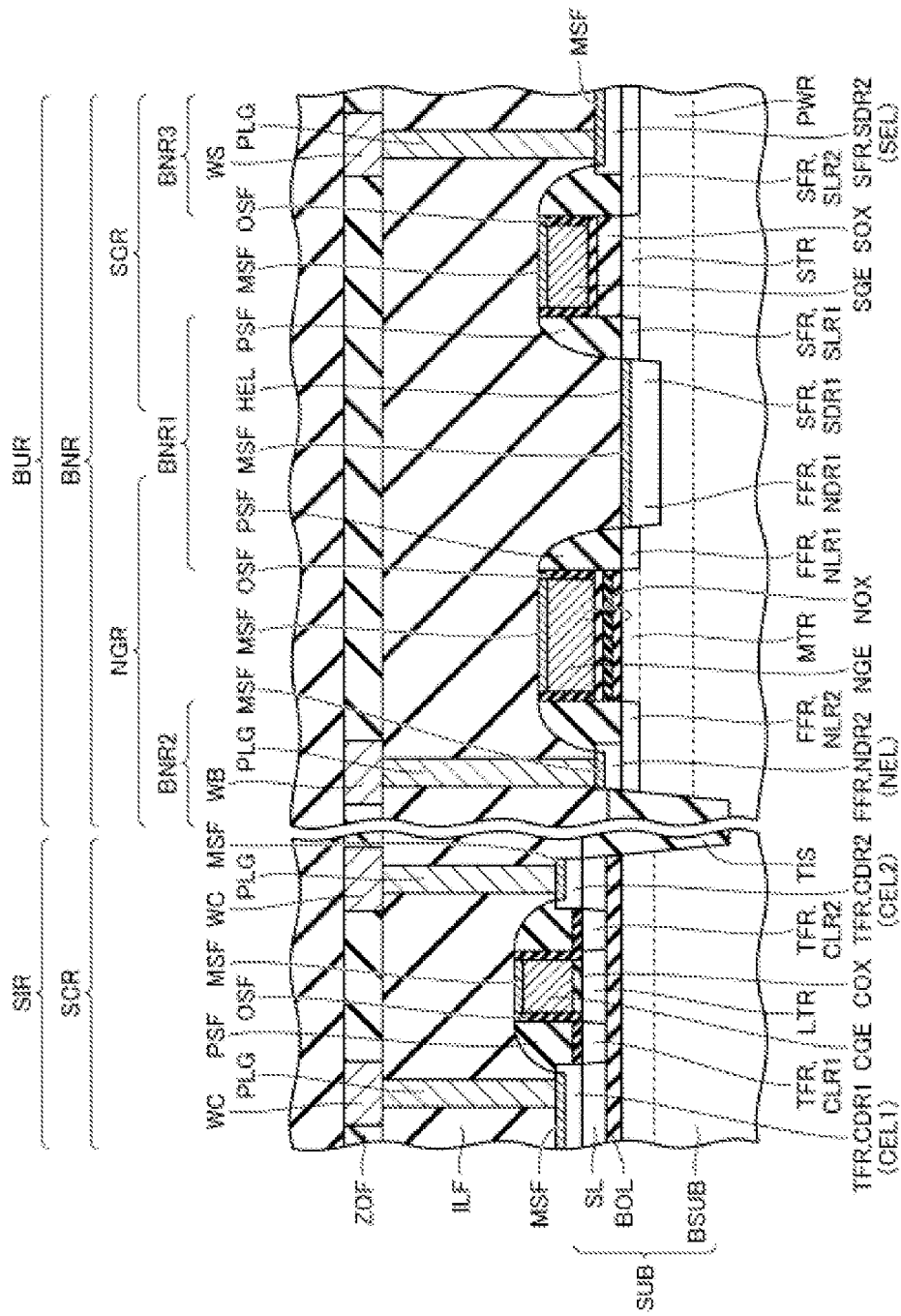
FIG. 1 is a cross-sectional view showing an example exemplary of a structure a semiconductor device according to each embodiment.

In a semiconductor device with flash memory according to the first embodiment, as shown in FIG. 1, SOI (Silicon On Insulator) substrate SUB is used. The SOI (semiconductor substrate) substrate SUB includes a silicon substrate (semiconductor-supporting substrate) BSUB, an insulating film (insulating layer) BOL formed on the silicon substrate BSUB, and a silicon layer (semiconductor layer) SL formed on the insulating film BOL.

In the SOI substrate SUB, an element region in which a transistor is formed is defined. In the present first embodiment, SOI substrate SUB (i.e., the element region) defines a bulk region BUR, which is an element region from which the silicon layer SL and the insulating film BOL are removed, and a SOI region SIR, which is an element region from which the silicon layer SL and the insulating film BOL are left.

Here, one memory cell of a flash memory is configured by one memory transistor and one select transistor, and an semiconductor device formed in a memory region in a bulk region and an manufacturing method thereof will be described. First, semiconductor device will be described.

As shown in FIG. 1, in the bulk-region BUR, a memory-region BNR (first-element region) and another region (not shown) are defined by the element isolation insulating film TIS. In SOI area SIR, for example, a low breakdown voltage MOS transistor area SCR (second device area) is defined.

In the memory region BNR, a p-type well region PWR is formed over a predetermined depth from the surface of the silicon substrate BSUB. In the memory region BNR (the well region PWR), the memory transistor region (the element region) NGR and the select transistor region (the element region) SGR are provided at a distance from each other. In the memory transistor area NGR, a memory transistor MTR is formed as a semiconductor element (transistor). In the select transistor area SGR, a select transistor STR is formed as a semiconductor element (transistor).

The memory transistor MTR includes the memory-gate insulating film NOX, a memory gate electrode NGE, and a first impurity diffused layer FFR (first impurity region). The memory-gate insulating film NOX includes a charge storage layer. The memory-gate insulating film NOX is formed by sequentially stacking a silicon oxide film, a silicon nitride film, and a silicon oxide film. The silicon nitride film serves as a charge storage layer. The memory gate electrode NGE is formed on the surface of the silicon substrate BSUB via the memory-gate insulating film NOX.

The first impurity diffusion layer FFR includes a first-diffusion-layer first portion (first-impurity-region first portion) NDR1 and a first-diffusion-layer second portion (first-impurity-region second portion) NDR2 into which relatively high-concentration impurities are respectively injected, and a first-LDD-diffusion-layer first portion NLR1 and a first-LDD-diffusion-layer second portion NLR2 into which relatively low-concentration impurities are respectively implanted. In addition, as used herein "LDD" is an abbreviation for "Lightly Doped Drain". A spacer film PSF is formed on each of side surfaces, which are opposed to each other, of the memory gate electrode NGE via an offset spacer film OSF.

The select transistor STR includes a select-gate insulating film SOX, a select gate electrode SGE, and a second impurity diffusion layer SFR (second impurity region). The select gate electrode SGE is formed on the surface of the silicon substrate BSUB via the select-gate insulating film SOX. The second impurity diffusion layer SFR includes a second-diffusion-layer first portion (second-impurity-region first portion) SDR1 and a second-diffusion-layer second portion (second-impurity-region second portion) SDR2 into which relatively high-concentration impurities are respectively injected, and a second-LDD-diffusion-layer first portion SLR1 and a second-LDD-diffusion-layer second portion SLR2 into which relatively low-concentration impurities are respectively implanted. A spacer film PSF is formed on each of side surfaces, which are opposed to each other, of the select gate electrode SGE via an offset spacer film OSF.

In the memory region BNR, a memory-region first portion BNR1 (first-element-region first portion) is defined in a silicon substrate BSUB located between the memory gate electrode NGE and the select gate electrode SGE. A memory-region second portion BNR2 (first-element-region second portion) is defined in a silicon substrate BSUB located on a side of the memory gate electrode NGE opposite to the side where the select gate electrode SGE is disposed. A memory-region third portion BNR3 (first-element-region third portion) is defined in a silicon substrate BSUB located opposite to the side on which the memory gate electrode NGE is disposed with respect to the select gate electrode SGE.

A first raised epitaxial layer NEL (first raised portion) is formed on a surface of the silicon substrate BSUB located on the memory-region second portion BNR2. The first raised epitaxial layer NEL is formed from the surface of the silicon substrate BSUB to a position higher than the surface thereof. A second raised epitaxial layer SEL (second raised portion) is formed on a surface of the silicon substrate BSUB located on the memory-region third portion BNR3. The second raised epitaxial layer SEL is formed from the surface of the silicon substrate BSUB to a position higher than the surface thereof.

On the other hand, no epitaxial layers are formed on the top surface of the silicon substrate BSUB located on the memory-region first portion BNR1. That is, the non-raised portion HEL in which the epitaxial layers are not formed is located in the memory-region first portion BNR1. In the memory-region first portion BNR1, the first-diffusion-layer first portion NDR1 (first-impurity-region first portion) of the memory transistor MTR, the first-LDD-diffusion layer first portion NLR1 of the memory transistor MTR, the second-diffusion-layer first portion SDR1 (second-impurity-region first portion) of the select transistor STR and the second-LDD-diffusion-layer first portion SLR1 of the select transistor STR are formed.

The first-LDD-diffusion layer first portion NLR1 and the second-LDD-diffusion-layer first portion SLR1 are formed from the surface of the silicon substrate BSUB (the surface of the metal silicide film MSF) to a predetermined depth. The first-diffusion-layer first portion NDR1 and the second-diffusion-layer first portion SDR1 are formed from the surface of the silicon substrate BSUB (the surface of the metal silicide film MSF) to a position deeper than the first-LDD-diffusion layer first portion NLR1 and the second-LDD-diffusion-layer first portion SLR1.

A metal silicide film MSF such as a nickel silicide film is formed in each of the surface of the first raised epitaxial layer NEL, the surface of the second raised epitaxial layer SEL, the upper surface of the memory gate electrode NGE, and the upper surface of the select gate electrode SGE. A metal silicide film MSF is also formed in the surface of the silicon substrate BSUB located at the non-raised portion HEL.

In the memory-region second portion BNR2, the second part NDR2 of the first diffusion layer is mainly formed in the first raised epitaxial layer NEL. The first-LDD-diffusion-layer second portion NLR2 is formed at a predetermined depth from the top surface of the silicon substrate BSUB. In the memory-region third portion BNR3, the second-diffusion-layer second portion SDR2 is mainly formed in the second raised epitaxial layer SEL. The second-LDD-diffusion-layer second portion SLR2 is formed at a predetermined depth from the top surface of the silicon substrate BSUB.

In the low breakdown voltage MOS transistor region SCR (second element region), a low breakdown voltage MOS transistor LTR is formed as a semiconducting element. The low breakdown voltage MOS transistor LTR includes a gate insulating film COX, a gate electrode CGE, and a third impurity diffused layer TFR (third impurity region). The gate electrode CGE is formed on the surface of the silicon layer SL via a gate insulating film COX. The third impurity diffusion layer TFR includes a third-diffusion-layer first portion (third-impurity-region first portion) CDR1 and a third-diffusion-layer second portion (third-impurity-region second portion) CDR2 into which relatively high-concentration impurities are respectively injected, and a third-LDD-diffusion-layer first portion CLR1 and a third-LDD-diffusion-layer second portion CLR2 into which relatively low-concentration impurities are respectively implanted. A spacer film PSF is formed on each of side surfaces, which are opposed to each other, of the gate electrode CGE via an offset spacer film OSF.

A third raised epitaxial layer CEL1 (third raised portion) is formed on the gate electrode CGE in the silicon layer SL located on one side of the gate electrode CGE in the gate length direction. The third raised epitaxial layer CEL1 is formed from the surface of the silicon layer SL to a position higher than the surface thereof. A fourth raised epitaxial layer CEL2 (fourth raised portion) is formed on the silicon layer SL located on the other side in the gate length direction with respect to the gate electrode CGE. The fourth raised epitaxial layer CEL2 is formed from the surface of the silicon layer SL to a position higher than the surface thereof.

The third-LDD-diffusion-layer first portion CLR1 and the third-LDD-diffusion-layer second portion CLR2 are formed so as to reach the insulating film BOL from the top surface of the silicon layer SL. The third-diffusion-layer first portion CDR1 is formed mainly in the third raised epitaxial layer CEL1. The third-diffusion-layer second portion CDR2 is formed mainly in the fourth raised epitaxial layer CEL2. A metal silicide film MSF is formed in each of the surface of the third raised epitaxial layer CEL1, the surface of the fourth raised epitaxial layer CEL2, and the upper surface of the gate electrode CGE.

An interlayer insulating film ILF is formed so as to cover the memory transistor MTR, the select transistor STR, the low breakdown voltage MOS transistor LTR, and the like. An insulating film ZOF is formed so as to cover the interlayer insulating film ILF. A wiring WB, a wiring WS, and a wiring WC are formed on the insulating film ZOF. The interconnect WB is electrically connected to the first diffusion-layer second portion and the like of the memory transistor MTR via the plugging PLUGS PLG. The interconnect WS is electrically connected to the second diffusion-layer second portion and the like of the select transistor STR via the plugging PLUGS PLG.

One wiring WC of wirings WC is electrically connected to the third diffusion-layer first portion CDR1 or the like via a plugging PLUGS PLG. Another wire WC is electrically connected to the third-diffusion-layer second portion CDR2 or the like via a plugging PLUGS PLG. An interlayer insulating film is formed so as to cover the wiring WB, the wiring WS, and the wiring WC. An upper wiring (not shown) is formed in the interlayer insulating film.

The semiconductor device according to the first embodiment is configured as described above. In the semiconductor device, in particular, in the memory region BNR, the non-raised portion HEL in which no epitaxial layer is formed is positioned in the memory-region first portion BNR1.

Next, a first example of a method of manufacturing of the semiconductor device in which the epitaxial layer is not formed in the memory-region first portion BNR1 will be described. First, a SOI substrate SUB is prepared. In SOI substrate SUB, a silicon layer SL is formed on a silicon substrate BSUB via an insulating film BOL (refer to FIG. 2). Next, by performing a predetermined photoengraving process, a photoresist pattern PR1 is formed which covers a region to be a SOI region SIR and exposes a region to be a bulk region BUR (see FIG. 2).

Figure 2:
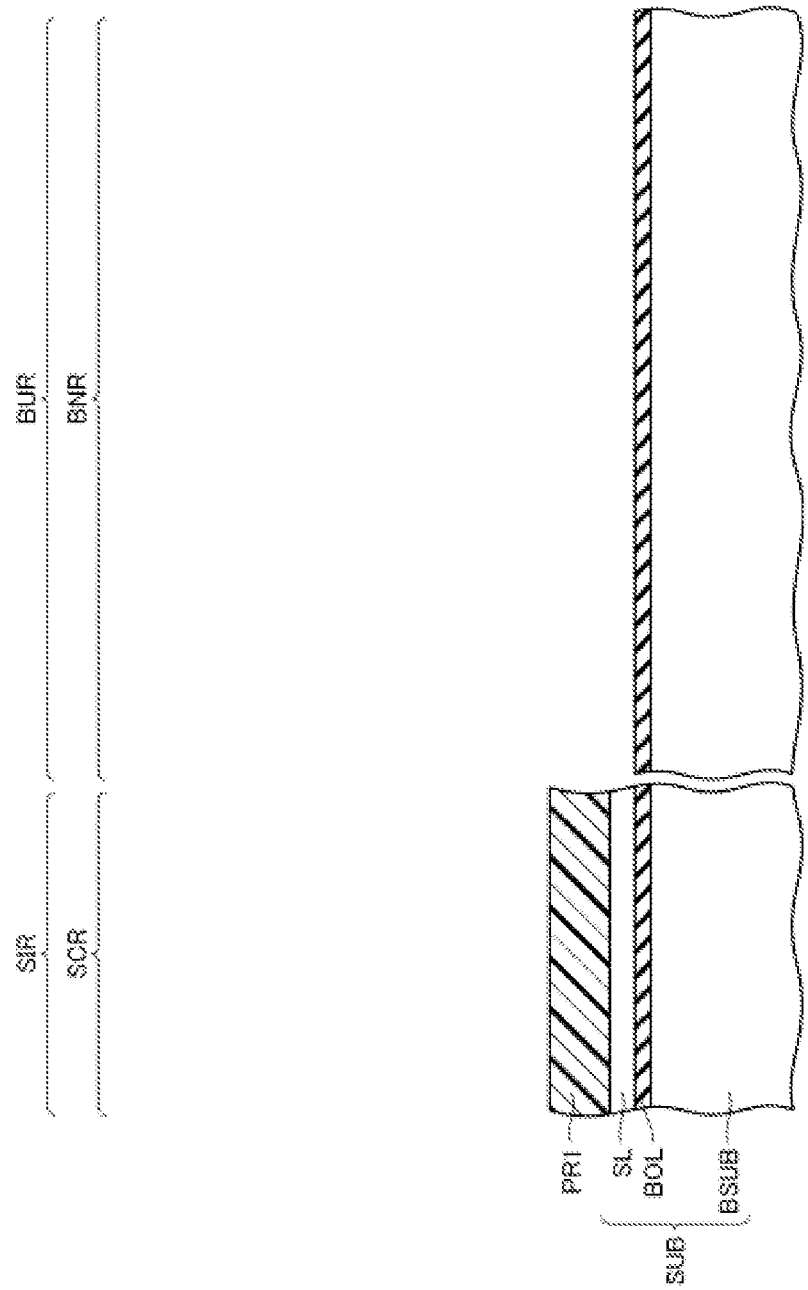
FIG. 2 is a cross-sectional view showing a step of a manufacturing method of the semiconductor device according to a first embodiment.

Next, as shown in FIG. 2, the exposed silicon-layer SL is removed using the photoresist pattern PR1 as an etch mask, thereby exposing the insulating film BOL located in the region that becomes the bulk-region BUR. Thereafter, the photoresist pattern PR1 is removed.

Figure 3:
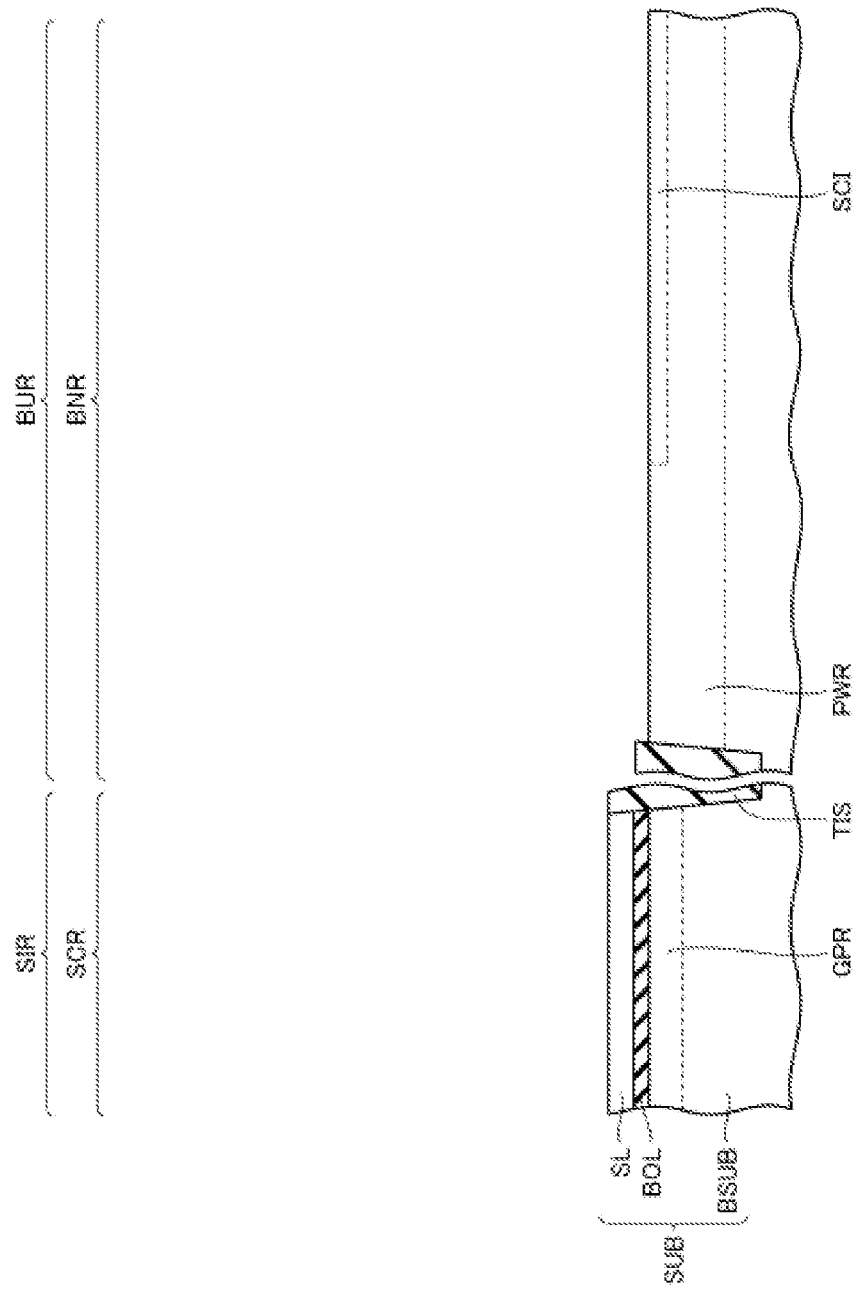
FIG. 3 is, in the first embodiment, a cross-sectional view showing a step to be performed after the step shown in FIG. 2.

Next, a device isolation insulating film TIS is formed by performing a predetermined photoengraving process, an etch process, a film forming process, and the like (see FIG. 3). In the region to be the bulk region BUR, the isolation insulating film TIS defines the memory region BNR and the like. In SOI area SIR, a low breakdown voltage MOS transistor area SCR or the like is defined.

Next, as shown in FIG. 3, the bulk region BUR is defined by removing the insulating film BOL located in the region that becomes the bulk region BUR. Next, a p-type well region PWR is formed in the silicon substrate BSUB located in the bulk region BUR by performing a predetermined photolithography process and ion-implantation process.

Next, by performing a predetermined photolithography process and an ion-implantation process, a channel-implantation region SCI is formed on the surface of the silicon substrate BSUB (that is, the surface of the well region PWR) located in the region where the select transistor is to be formed in the memory region BNR. The threshold voltage of the select transistor is adjusted by the channel-implantation-region SCI.

In SOI area SIR, the ground plane area GPR is formed on the silicon substrate BSUB located immediately below the insulating film BOL by performing a predetermined photolithography process and ion-implantation process. The threshold voltage of the low breakdown voltage MOS transistor is adjusted by the ground plane area GPR.

Figure 4:
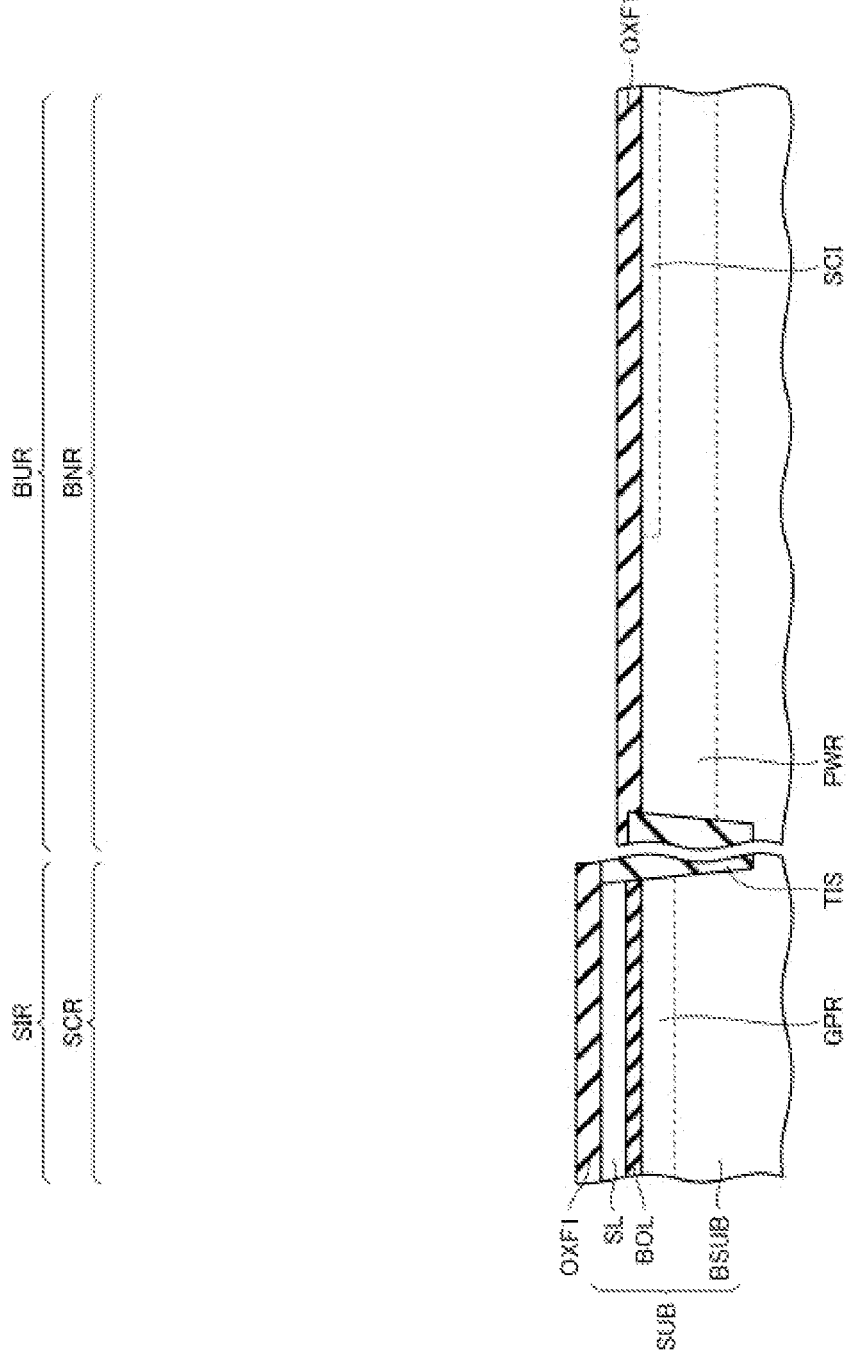
FIG. 4 is, in the first embodiment, a cross-sectional view showing a step to be performed after the step shown in FIG. 3.

Next, as shown in FIG. 4, by performing a thermal oxidation treatment, a silicon oxide film OXF1 is formed on the surface of the silicon layer SL (specifically, on the surface of the silicon layer SL and a part of the surface) and the surface of the silicon substrate BSUB (specifically, on the surface of the silicon substrate BSUB and a part of the surface). The silicon-oxide film OXF1 serves as the select-gate insulating film of the select transistor.

Figure 5:
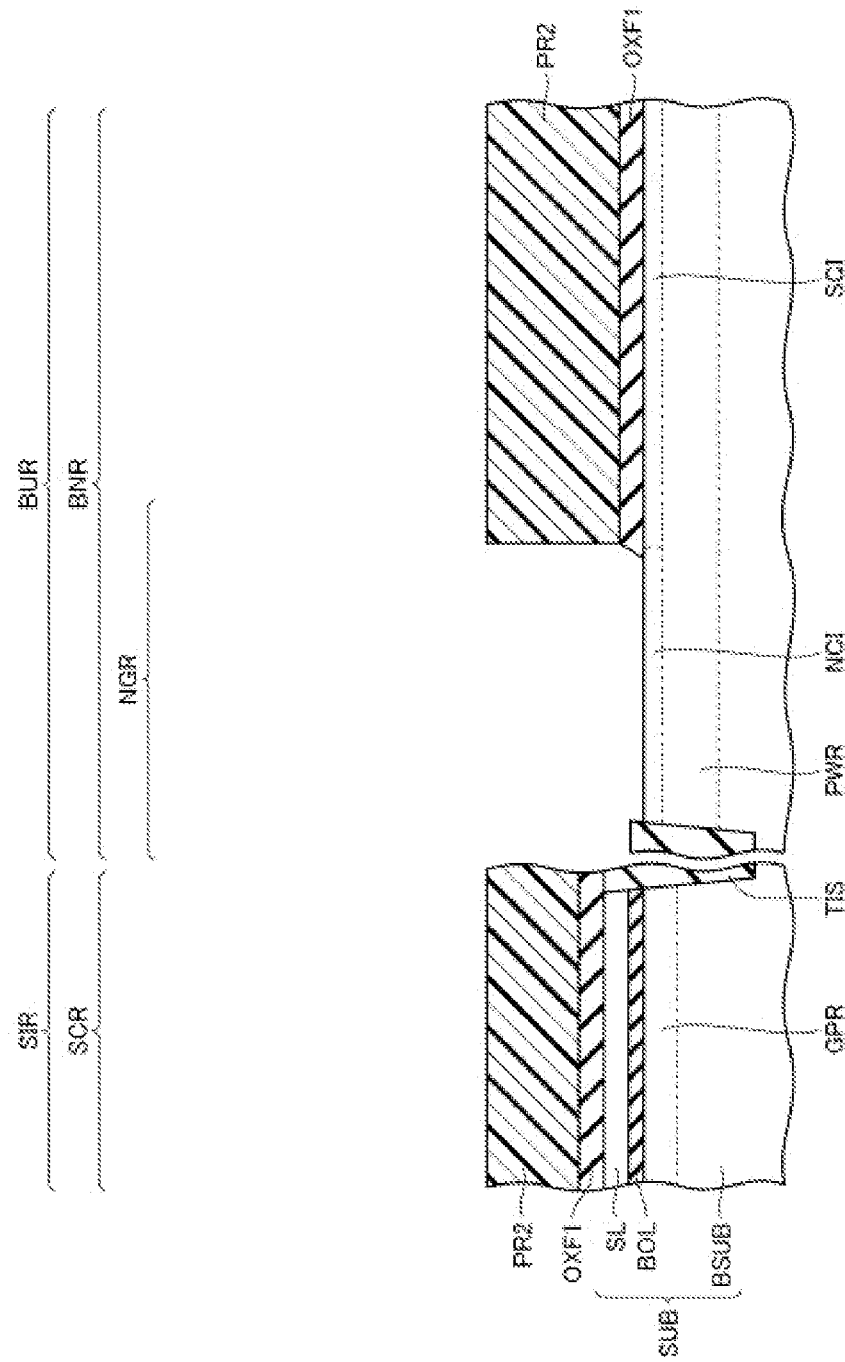
FIG. 5 is, in the first embodiment, a cross-sectional view showing a step to be performed after the step shown in FIG. 4.

Next, by performing a predetermined photoengraving process, a photoresist pattern PR2 that exposes the memory transistor region NGR and covers other regions is formed (see FIG. 5). Next, an ion implantation process is performed using the photoresist pattern PR2 as an implantation mask, whereby a channel implantation region NCI is formed on the exposed surface of the silicon substrate BSUB (that is, the surface of the well region PWR located in the memory transistor region NGR). The threshold voltage of the memory transistor is adjusted by the channel-implantation-region NCI.

Next, as shown in FIG. 5, by performing an etching process using the photoresist pattern PR2 as an etching mask, the silicon oxide film OXF1 located in the memory transistor area NGR is removed. Thereafter, the photoresist pattern PR2 is removed.

Figure 6:
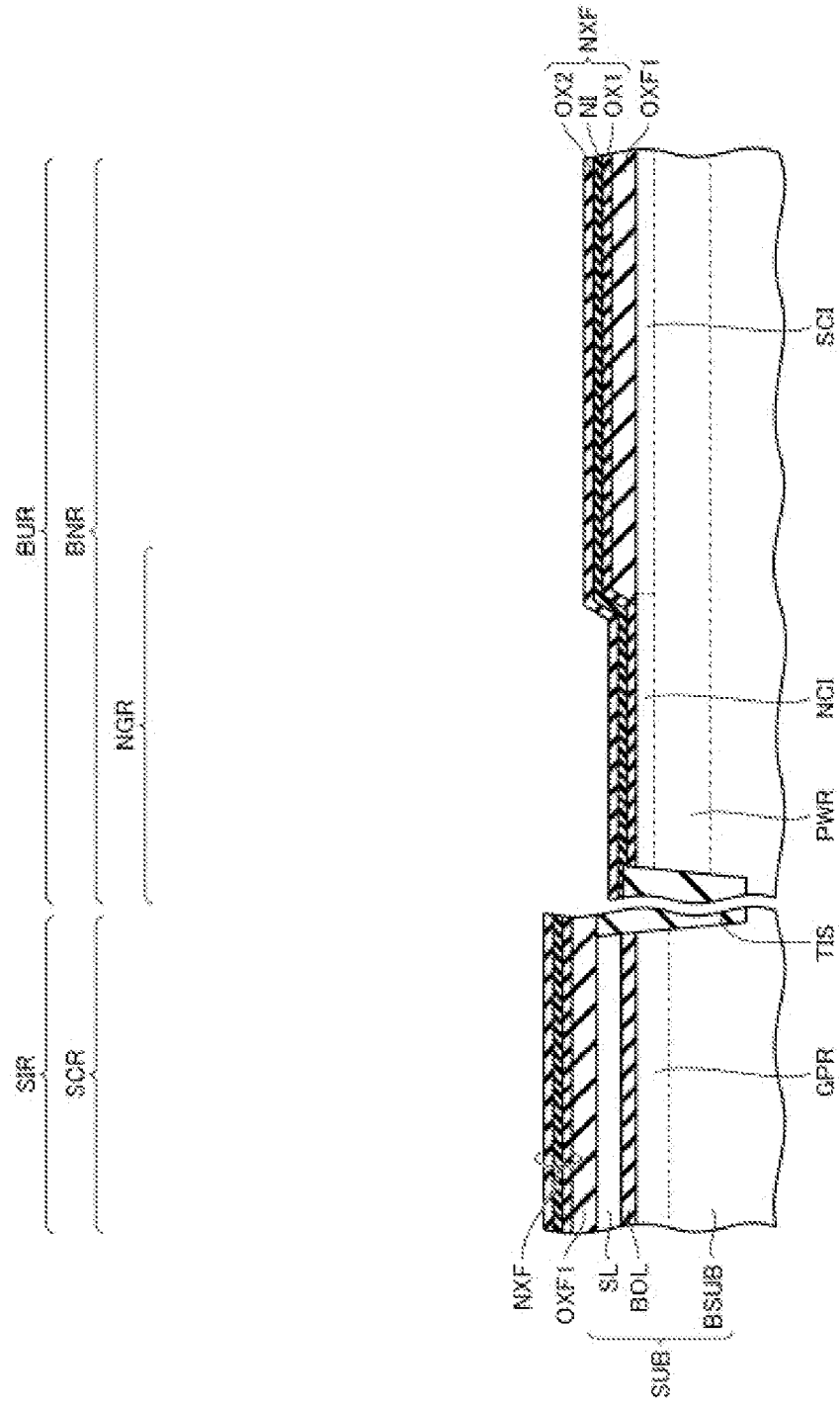
FIG. 6 is, in the first embodiment, a cross-sectional view showing a step to be performed after the step shown in FIG. 5.

Next, as shown in FIG. 6, an ONO film NXF in which a silicon oxide film OX1, a silicon nitride film NI and a silicon oxide film OX2 are sequentially laminated is formed by, for example, a thermal oxidation method and a CVD method (Chemical Vapor Deposition). The ONO film NXF is the memory-gate insulating film of the memory transistor. In the ONO film NXF, the silicon nitride film NI serves as the charge storage layer.

Figure 7:
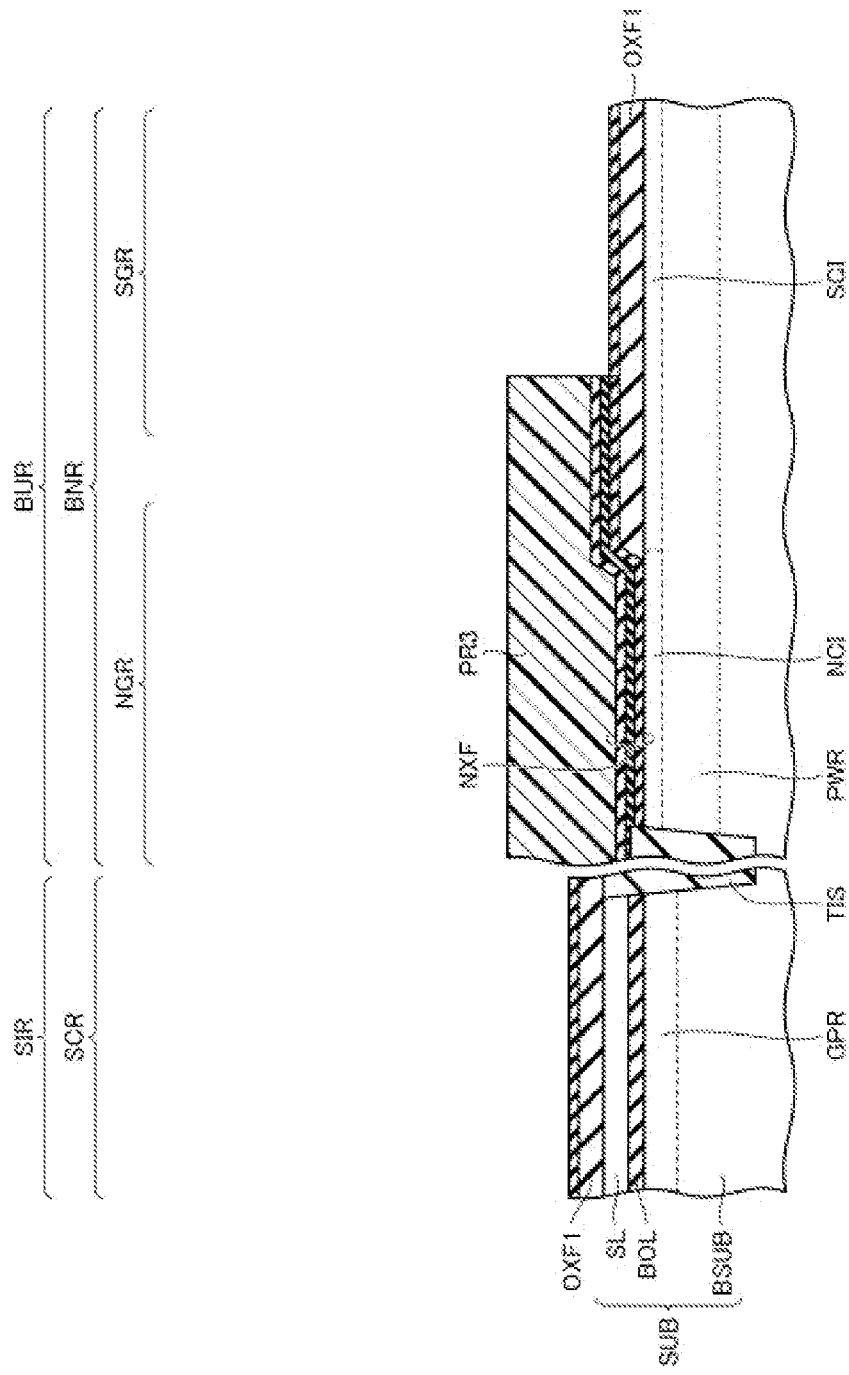
FIG. 7 is, in the first embodiment, a cross-sectional view showing a step to be performed after the step shown in FIG. 6.

Next, as shown in FIG. 7, by performing a predetermined photoengraving process, a photoresist pattern PR3 covering a region including the memory transistor region NGR and exposing another region is formed. At this time, the photoresist pattern PR3 is formed so as to cover portions of the silicon oxide film OXF1 and ONO film NXF stacked in a region corresponding to the memory-region first portion BNR1 (refer to FIG. 1) among portions in which ONO film NXF is stacked so as to cover the silicon oxide film OXF1.

Next, the exposed ONO film NXF is removed by performing an etching process using the photoresist pattern PR3 as an etching mask. Thereafter, the photoresist pattern PR3 is removed. Next, by performing a predetermined photoengraving process, a photoresist pattern (not shown) that covers the bulk-region BUR and exposes SOI region SIR is formed. Next, an etching process is performed using the photoresist pattern as an etching mask to remove the silicon oxide film OXF1 or the like located in SOI area SIR. Thereafter, the photoresist pattern is removed.

Figure 8:
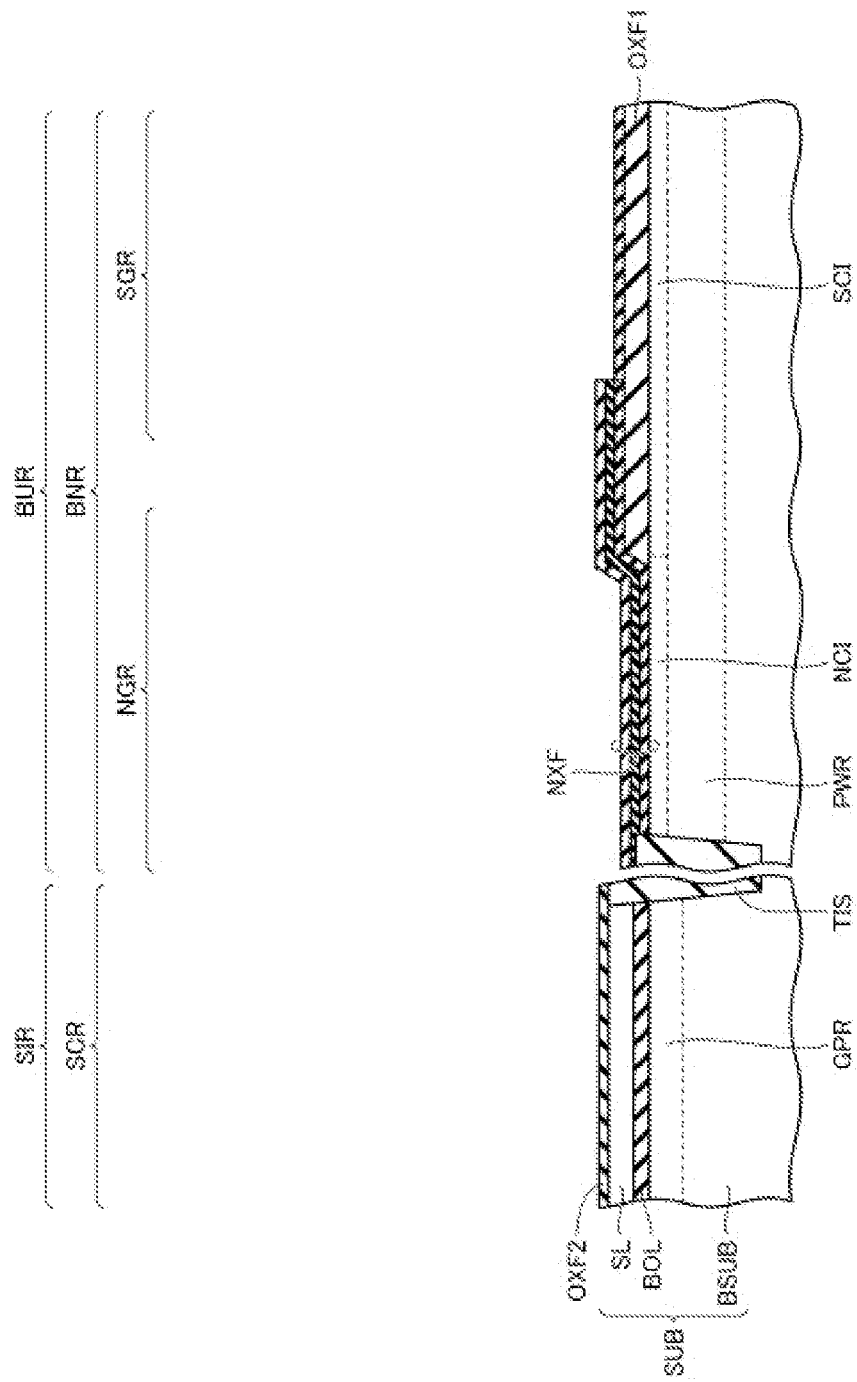
FIG. 8 is, in the first embodiment, a cross-sectional view showing a step to be performed after the step shown in FIG. 7.

Next, as shown in FIG. 8, a silicon oxide film OXF2 is formed on the silicon layers SL by performing a thermal oxidation treatment. The silicon-oxide film OXF2 is a gate-insulating film of a low breakdown voltage MOS transistor. Next, a polysilicon film (not shown) is formed by, for example, a CVD method so as to cover the silicon oxide film OXF1, the silicon oxide film OXF2, ONO film NXF, and the like. For example, a silicon nitride film (not shown) is formed as a hard mask HM (see FIG. 9) so as to cover the polysilicon film.

Figure 9:
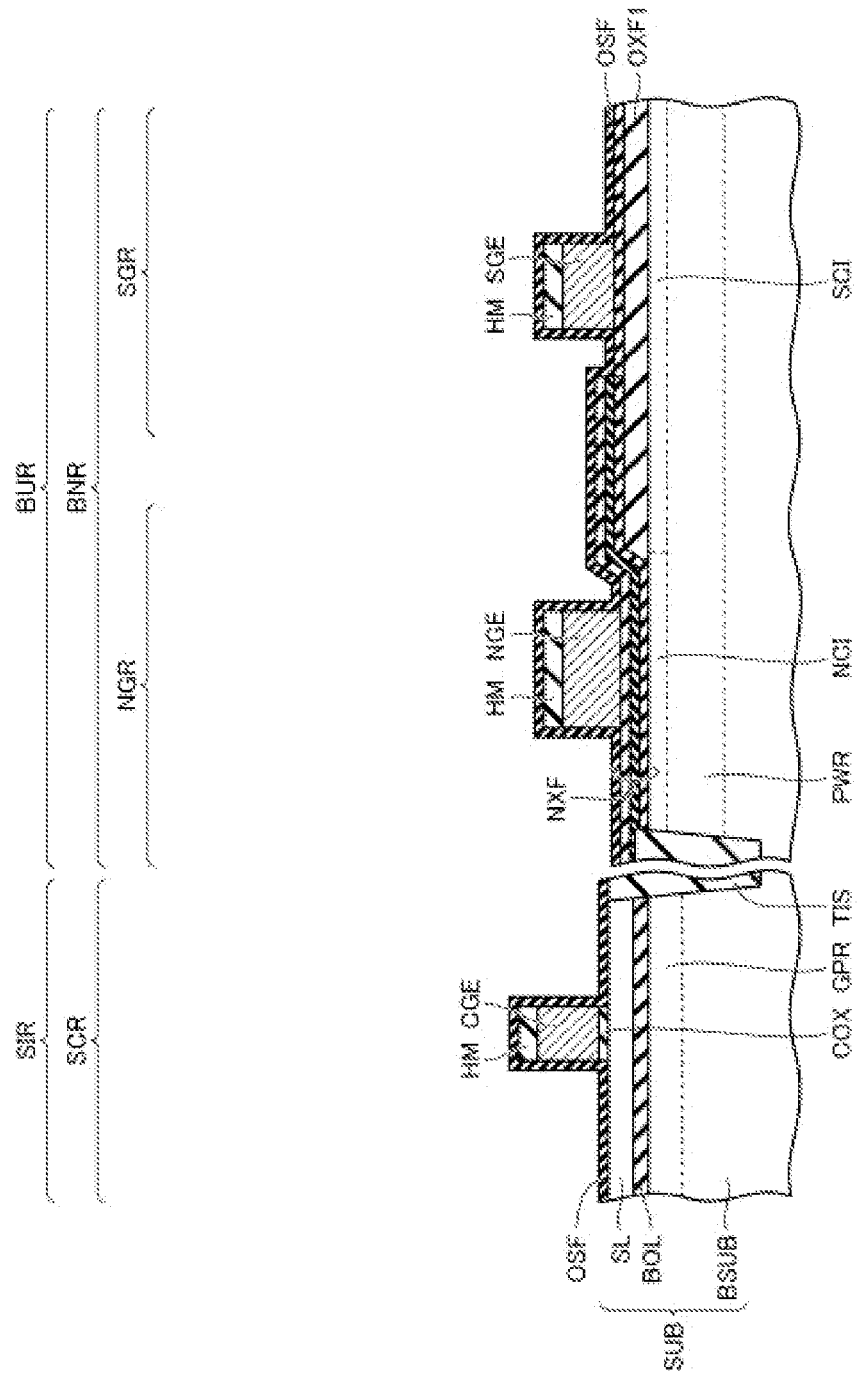
FIG. 9 is, in the first embodiment, a cross-sectional view showing a step to be performed after the step shown in FIG. 8.

Next, the memory gate electrode NGE, the select gate electrode SGE, and the gate electrode CGE are patterned by performing a predetermined photolithography process and an etch process (see FIG. 9). Next, as shown in FIG. 9, an offset spacer film OSF is formed so as to cover the memory gate electrode NGE, the select gate electrode SGE, and the gate electrode CGE.

Figure 10:
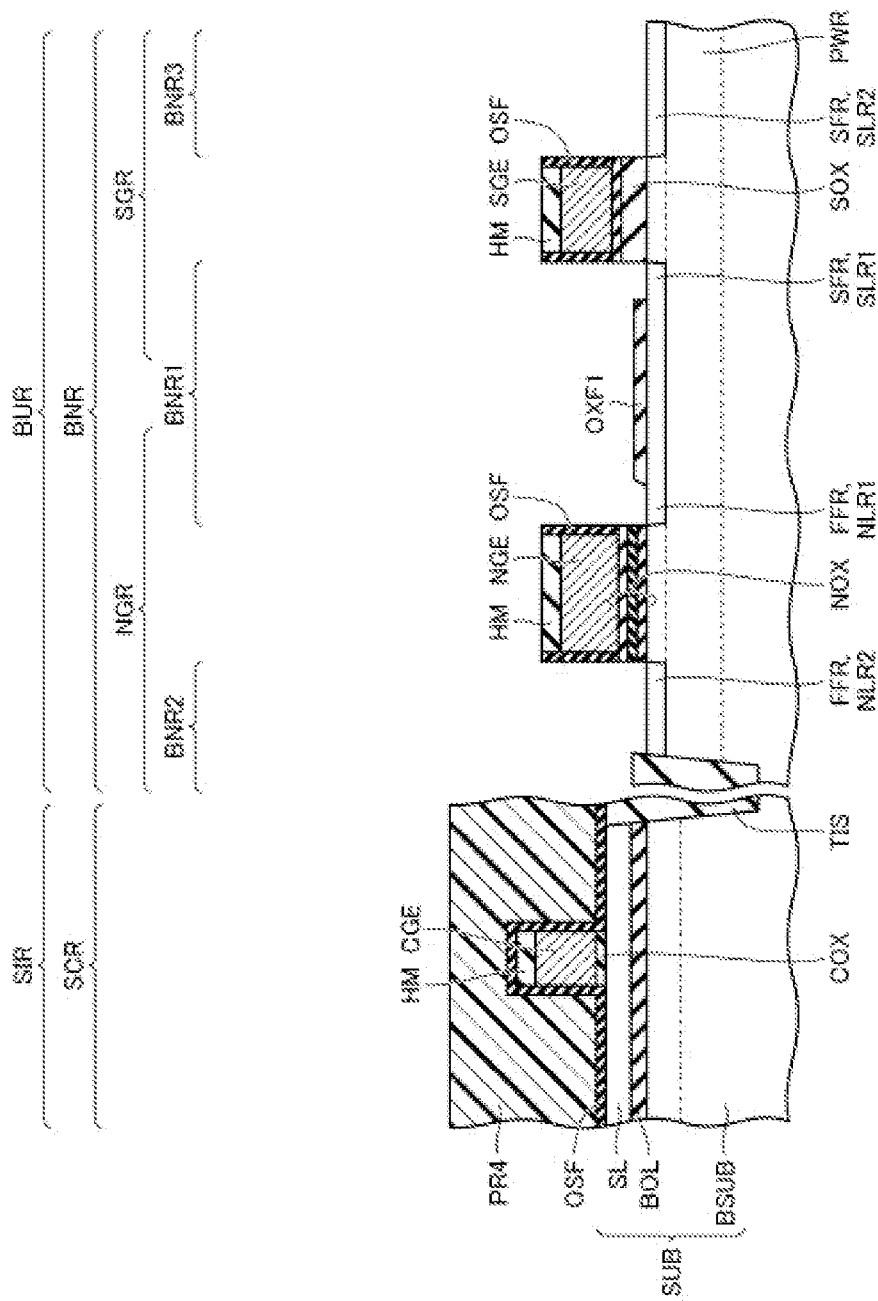
FIG. 10 is, in the first embodiment, a cross-sectional view showing a step to be performed after the step shown in FIG. 9.

Next, as shown in FIG. 10, by performing a predetermined photoengraving process, a photoresist pattern PR4 covering SOI regions SIR and exposing the bulk-regions BUR is formed. Next, an etching process is performed using the photoresist pattern PR4 as an etching mask. At this time, in the memory-region first portion BNR1, the etching process is performed in such a manner that the silicon oxide film OXF1 remains.

In the memory-region second portion BNR2, the offset spacer film OXF, ONO film NXF and the silicon oxide film OXF1 are removed to expose the silicon substrate BSUB. In the memory-region third portion BNR3, the offset spacer film OXF and the silicon oxide film OXF1 are removed to expose the silicon substrate BSUB. On the other hand, in the memory-region first portion BNR1, the silicon oxide film OXF1 is partially removed from the offset spacer film OXF, ONO film NXF and the silicon oxide film OXF1.

Next, using the memory gate electrode NGE, the select gate electrode SGE, and the photoresist pattern PR4 as an implantation mask, for example, an n-type impurity is implanted into the exposed silicon substrate BSUB. Then, the implanted impurities are diffused by the heat treatment. Consequently, a relatively low-concentration impurity region is formed on the surface of the silicon substrate BSUB located on the memory-region first portion BNR1 (that is, on the surface of the well region PWR). The impurity region (low-concentration region) includes the first-LDD-diffusion layer first portion NLR1 of the memory transistor MTR and the second-LDD-diffusion-layer first portion SLR1 of the select transistor STR. In the memory-region second portion BNR2, the first-LDD-diffusion-layer second portion NLR2 is formed. In the memory-region third portion BNR3, the second-LDD-diffusion-layer second portion SLR2 is formed. Thereafter, the photoresist pattern PR4 is removed.

Figure 11:
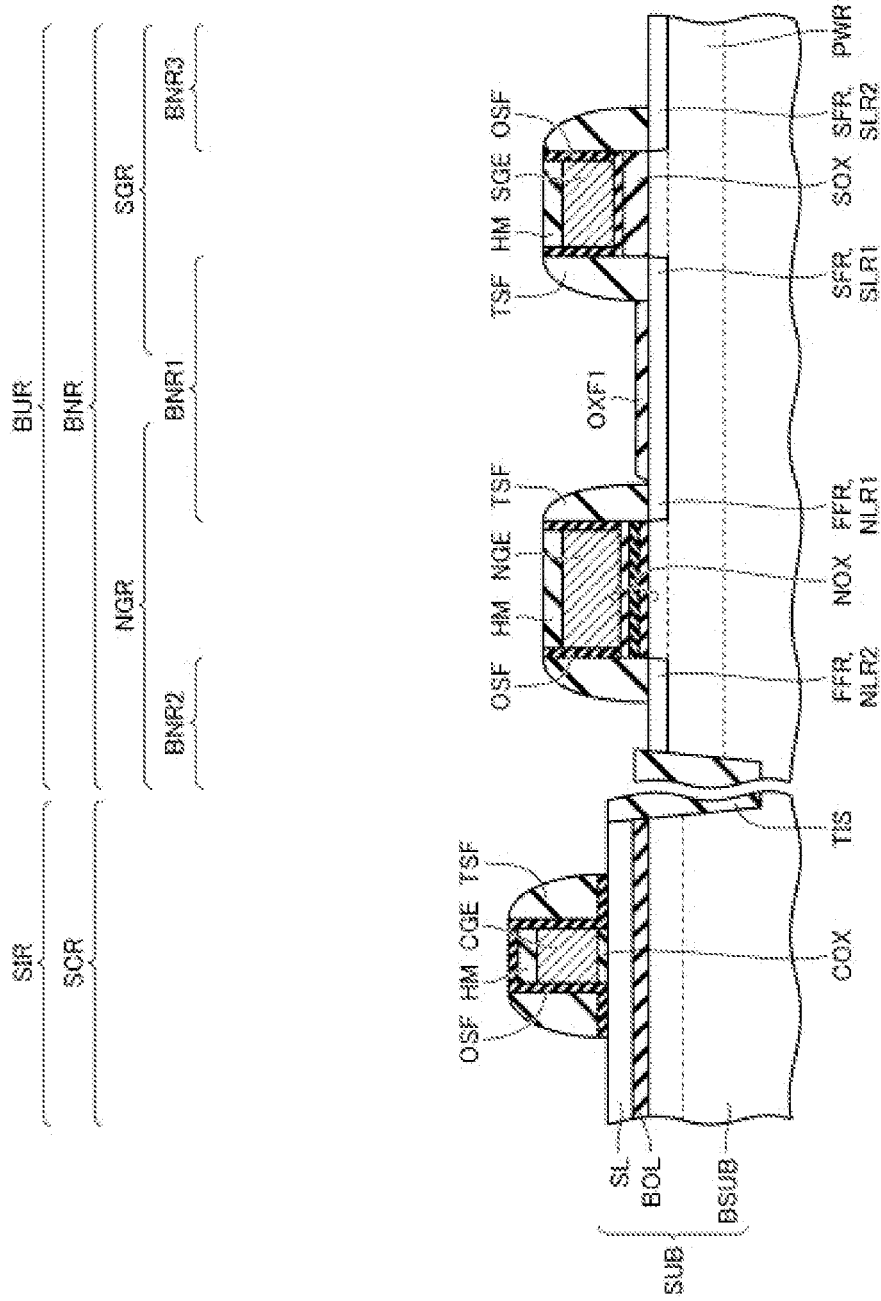
FIG. 11 is, in the first embodiment, a cross-sectional view showing a step to be performed after the step shown in FIG. 10.

Next, as shown in FIG. 11, a spacer film TSF is formed on each side surface of the memory gate electrode NGE, the select gate electrode SGE, the gate electrode CGE, and the like. As a result, the memory-region first portion BNR1 is covered with the silicon substrate BSUB by the silicon oxide film OXF1 and the spacer film TSF (blocking film).

Figure 12:
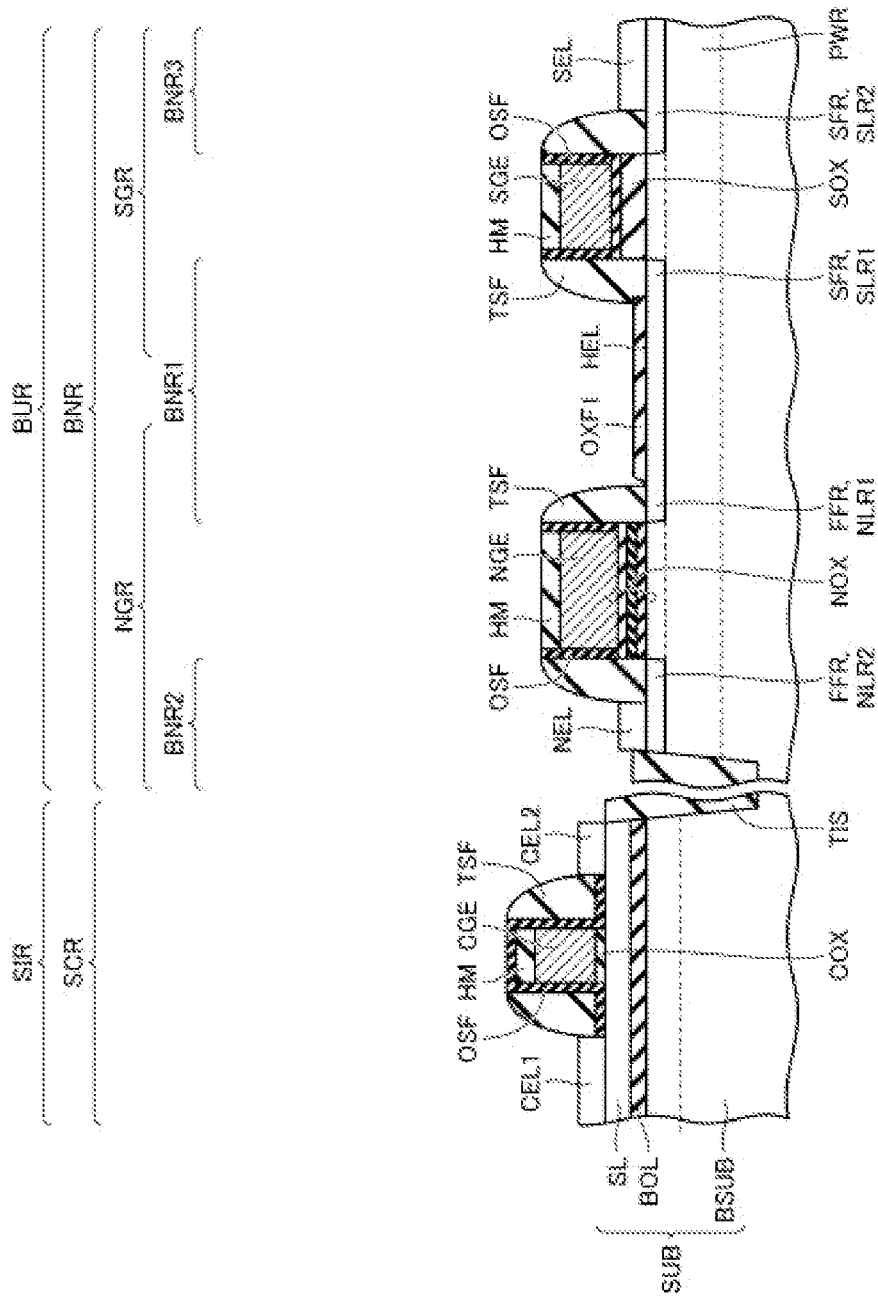
FIG. 12 is, in the first embodiment, a cross-sectional view showing a step to be performed after the step shown in FIG. 11.

Next, as shown in FIG. 12, epitaxial growth of silicon is performed on the exposed silicon substrate BSUB or the like by an epitaxial growth method. In the memory-region second portion BNR2 of the memory region BNR in the bulk area BUR, the first raised epitaxial layer NEL is formed on the surface of the silicon substrate BSUB. Also, in the memory-region third portion BNR3 of the memory region BNR in the bulk area BUR, the second raised epitaxial layer SEL is formed on the surface of the silicon substrate BSUB. Further, also in SOI area SIR, the third raised epitaxial layer CEL1 and the fourth raised epitaxial layer CEL2 are formed on the surface of the silicon layer SL.

On the other hand, in the memory-region first portion BNR1 of the memory region BNR in the bulk region BUR, the silicon substrate BSUB is covered with the silicon oxide film OXF1 and the spacer film TSF, so that the epitaxial growth of silicon is not performed.

In recent years, further cost-reduction of semiconductor device is also required. In order to reduce the manufacturing cost of semiconductor device, for example, in the step of performing the etching process shown in FIG. 10, the etching process is performed so that the silicon oxide film OXF1 does not remain. In the step of forming the raised epitaxial layers shown in FIG. 12, it is conceivable to simplify (reduce) the series of manufacturing processes by forming raised epitaxial layers not only in SOI area SIR, the memory-region second portion BNR2, and the memory-region third portion BNR3, but also in the memory-region first portion BNR1.

However, as described above, if the raised epitaxial layers are formed on the top surface of semiconductor substrate located between the memory transistor and the select transistor, the resistivity of semiconductor substrate, which is the path between the memory transistor and the select transistor, increases in the path through which the current (electron) flows. Therefore, when further reducing the power consumption of semiconductor device is taken into account, as in the present embodiment, in the step of forming the raised epitaxial layer on the low breakdown voltage MOS transistor region SCR in SOI region SIR, the raised epitaxial layer is also formed on the memory-region second portion BNR2 and the memory-region third portion BNR3 of the memory region BNR in the bulk region BUR, but it is preferable that the raised epitaxial layer is not formed on the memory-region first portion BNR1 of the memory region BNR in the bulk region BUR.

Figure 13:
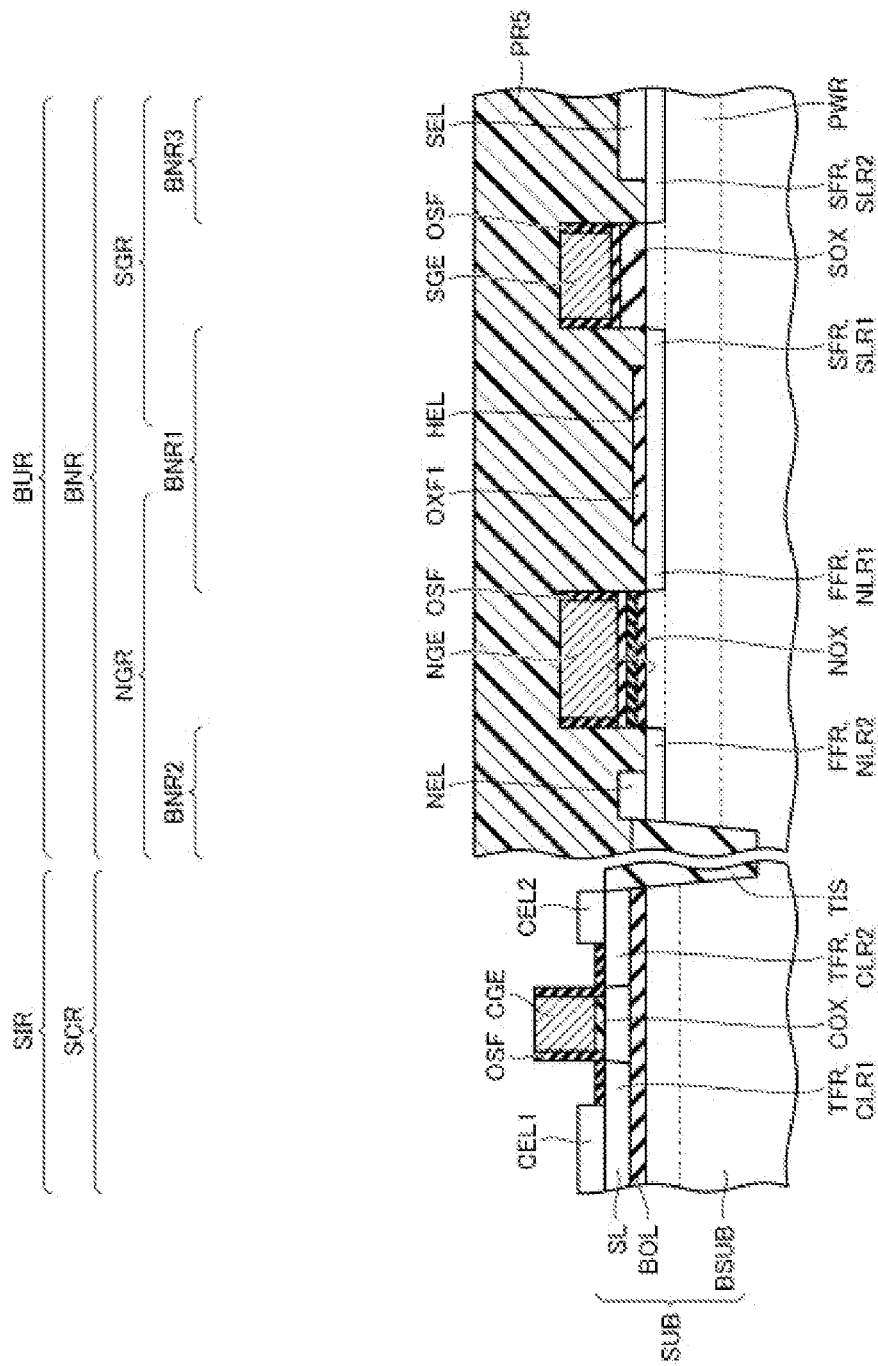
FIG. 13 is, in the first embodiment, a cross-sectional view showing a step to be performed after the step shown in FIG. 12.

Next, the spacer film TSF, the hard mask HM, and the like are removed by performing, for example, a wet etching process. Next, as shown in FIG. 13, by performing a predetermined photoengraving process, a photoresist pattern PR5 that covers the bulk-region BUR and exposes SOI region SIR is formed. Next, using the gate electrode CGE and the photoresist pattern PR5 as an implantation mask, n-type impurities are implanted into the respective surfaces of the third raised epitaxial layer CEL1 and the fourth raised epitaxial layer CEL2 with the exposed silicon layer SL (that is, the silicon layer SL located between the third raised epitaxial layer CEL1 and the gate electrode CGE and the silicon layer SL located between the fourth raised epitaxial layer CEL2 and the gate electrode CGE). Then, the implanted impurities are diffused by the heat treatment. Consequently, the exposed silicon layer SL, the third surface epitaxial layer CEL1, and the fourth raised epitaxial layer CEL2, respectively, the third-LDD-diffusion-layer first portion CLR1 and the third-LDD-diffusion-layer second portion CLR2 are formed. Thereafter, the photoresist pattern PR5 is removed.

Figure 14:
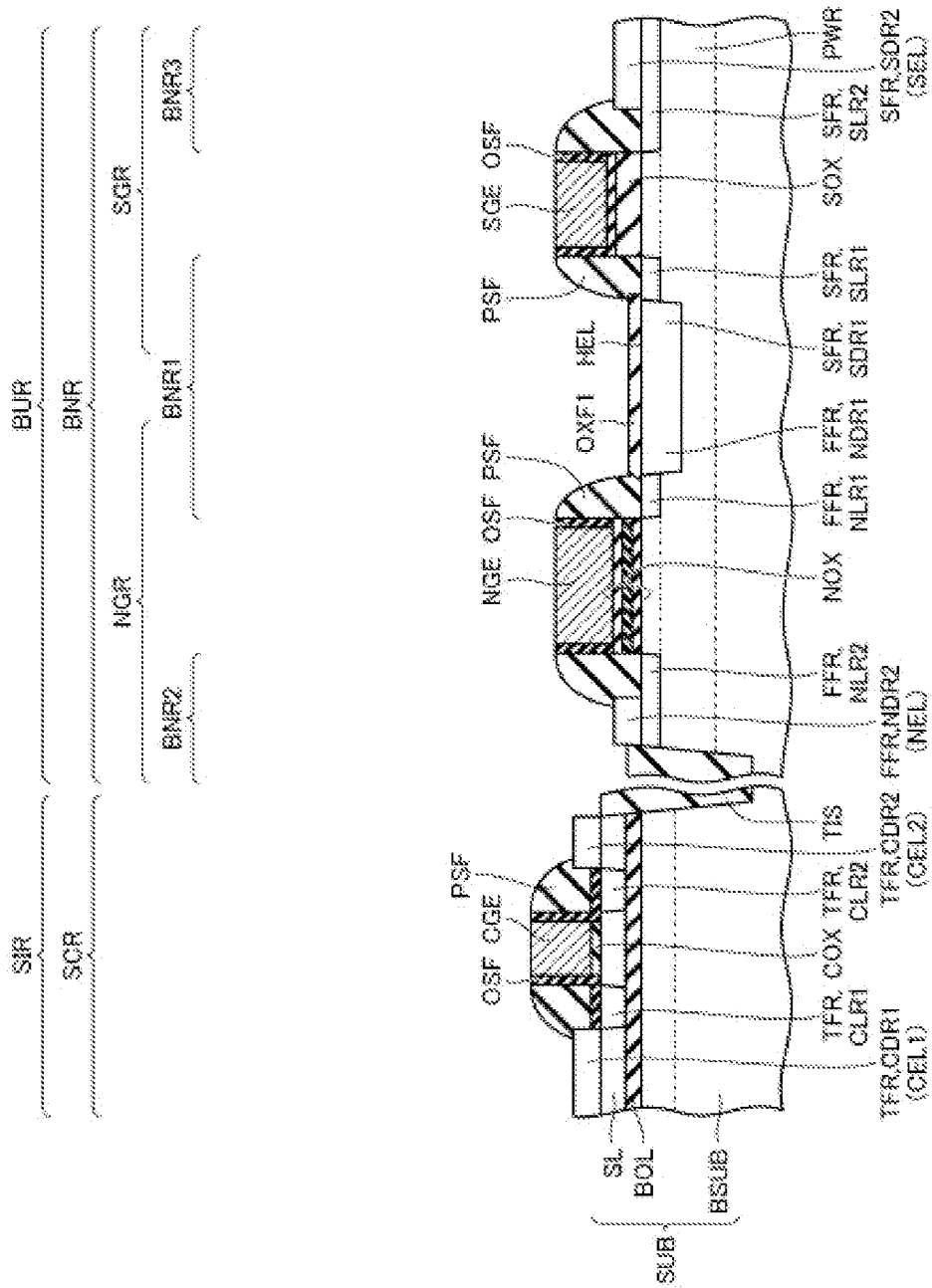
FIG. 14 is, in the first embodiment, a cross-sectional view showing a step to be performed after the step shown in FIG. 13.

Next, as shown in FIG. 14, a spacer film PSF is formed on each side surface of the memory gate electrode NGE, the select gate electrode SGE, the gate electrode CGE, and the like. Next, by performing a predetermined photoengraving process, a photoresist pattern (not shown) that covers SOI regions SIR and exposes the bulk-regions BUR is formed. Next, the exposed surface of the silicon substrate BSUB, the exposed sur face of the first raised epitaxial layer NEL, and the exposed surface of the second raised epitaxial layer SEL are implanted with, for example, n-type impurities using the photoresist pattern, the memory gate electrode NGE, the select gate electrode SGE, and the like as an implantation mass.

Then, the implanted impurities are diffused by the heat treatment. Consequently, a relatively high-concentration impurity region is formed on the surface of the silicon substrate BSUB located on the memory-region first portion BNR1 (i.e., a portion of the first-LDD-diffusion-layer first portion NLR1, a portion of the second-LDD-diffusion-layer first portion SLR1, and a portion of the well region PWR). The impurity region (high-concentration region) includes the first-diffusion-layer first portion NDR1 of the memory transistor MTR and the second-diffusion-layer first portion SDR1 of the select transistor STR.

In the memory-region second portion BNR2, the second part NDR2 of the first diffusion layer is formed on the first raised epitaxial layer NEL and the top surface (i.e., a part of the first-LDD-diffusion-layer second portion NLR2) of the silicon substrate BSUB located immediately below the first raised epitaxial layer NEL. In the memory-region third portion BNR3, the second-diffusion-layer second portion SDR2 is formed on the second raised epitaxial layer SEL and the top surface (i.e., a part of the second-LDD-diffusion-layer second portion SLR2) of the silicon substrate BSUB located immediately below the second raised epitaxial layer SEL. Thereafter, the photoresist pattern is removed.

Next, by performing a predetermined photoengraving process, a photoresist pattern (not shown) that covers the bulk-region BUR and exposes SOT region SIR is formed. Next, using the photoresist pattern, the gate electrode CGE, and the like as an implantation mass, for example, n-type impurities are implanted into the exposed surface of the third raised epitaxial layer CEL1 and the exposed surface of the fourth raised epitaxial layer CEL2.

Then, the implanted impurities are diffused by the heat treatment. Consequently, the third-diffusion-layer first portion CDR1 is formed in the third raised epitaxial layer CEL1 and the silicon layer SL (that is, a part of the third-LDD-diffusion-layer first portion CLR1) located immediately below the third raised epitaxial layer CEL1. In addition, the third-diffusion-layer second portion CDR2 is formed in the fourth raised epitaxial layer CEL2 and the silicon layer SL (that is, a part of the third-LDD-diffusion-layer second portion CLR2) located immediately below the fourth raised epitaxial layer CEL2. Thereafter, the photoresist pattern is removed.

Figure 15:
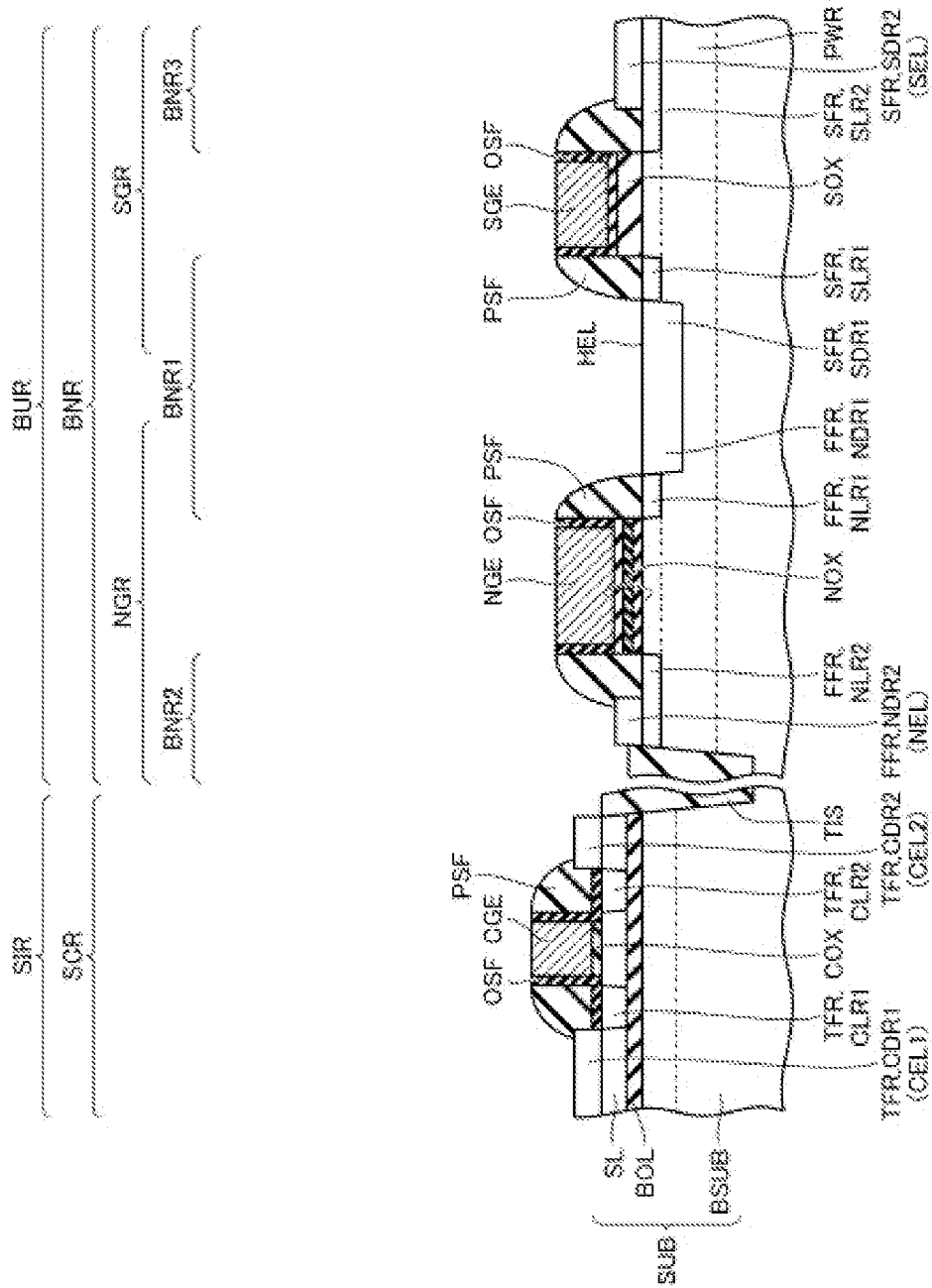
FIG. 15 is, in the first embodiment, a cross-sectional view showing a step to be performed after the step shown in FIG. 14.

Next, as shown in FIG. 15, the silicon oxide film OXF1 is removed, for example, by performing a wet etching process. In particular, in the memory-region first portion BNR1, the silicon oxide film OXF1 is removed to expose the silicon substrate BSUB.

Figure 16:
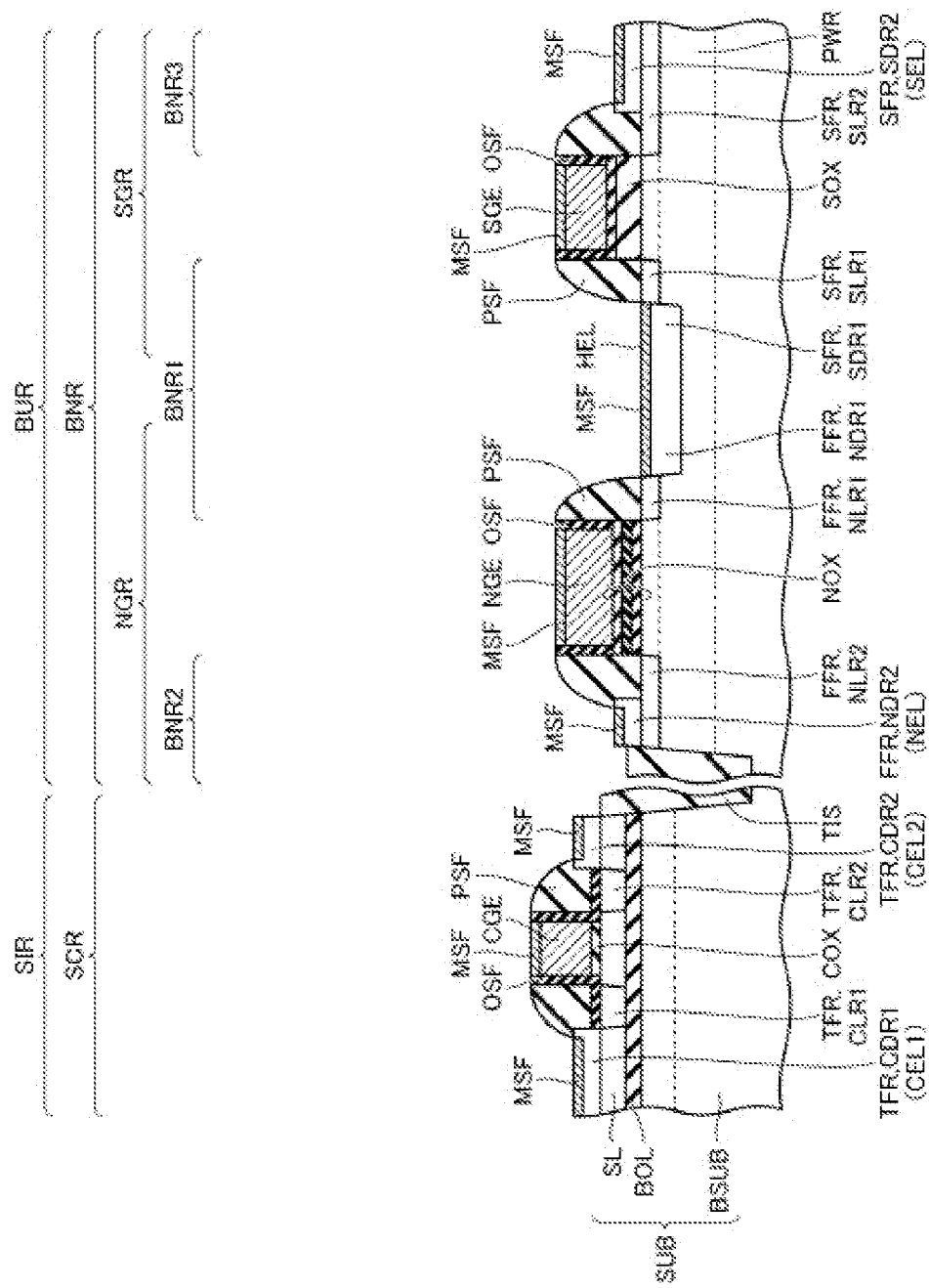
FIG. 16 is, in the first embodiment, a cross-sectional view showing a step to be performed after the step shown in FIG. 15.

Next, as shown in FIG. 16, a metal silicide film MSF such as nickel silicide is formed by a salicide method. In the memory-region first portion BNR1, a metal silicide film MSF is formed in the surface of the silicon substrate BSUB (the first-diffusion-layer first portion NDR1 of the first diffusion layer and the second-diffusion-layer first portion SDR1 of the second diffusion layer). In the memory-region second portion BNR2, a metal silicide film MSF is formed in the surface of the first raised epitaxial layer NEL. In the memory-region third portion BNR3, a metal silicide film MSF is formed in the surface of the second surface epitaxial layer SEL. In addition, a metal silicide film MSF is formed in an upper surface of the memory gate electrode NGE. A metal silicide film MSF is formed in an upper surface of the select gate electrode SGE.

In SOI area SIR, a metal silicide film MSF is formed in the surface of the third surface epitaxial layer CEL1. A metal silicide film MSF is formed in the surface of the fourth surface epitaxial layer CEL2. In addition, a metal silicide film MSF is formed in the upper surface of the gate electrode CGE.

Figure 17:
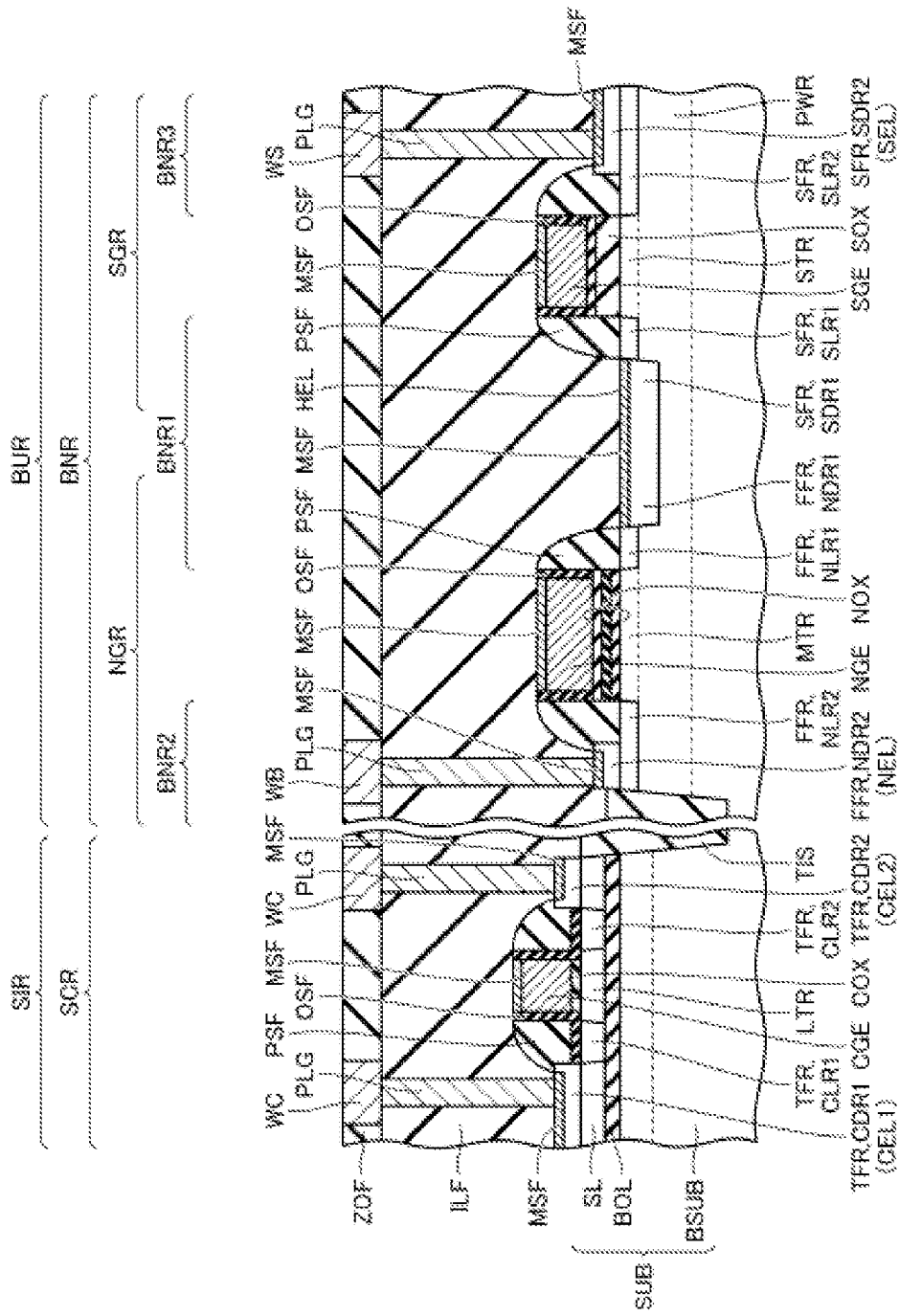
FIG. 17 is, in the first embodiment, a cross-sectional view showing a step to be performed after the step shown in FIG. 16.

Next, as shown in FIG. 17, an interlayer insulating film ILF such as a silicon oxide film is formed so as to cover the memory transistor MTR, the select transistor STR, the low breakdown voltage MOS transistor LTR, and the like. Next, a plugging PLUGS PLG penetrating through the interlayer insulating film ILF and reaching the respective metal silicide films MSF is formed. Next, an insulating film ZOF is formed so as to cover the interlayer insulating film ILF. A wiring WB, a wiring WC, and a wiring WC are formed on the insulating film ZOF by, for example, a damascene method. Thereafter, semiconductor device shown in FIG. 1 is completed by forming an upper-layer interconnect (not shown).

Figure 18:
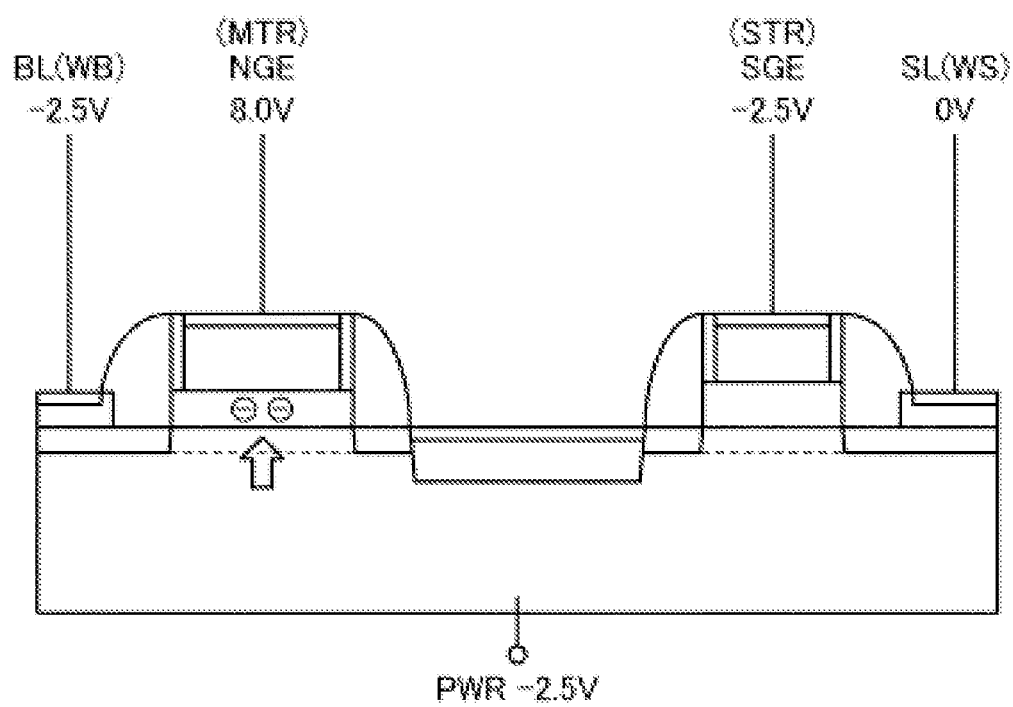
FIG. 18 is, in the first embodiment, a diagram for explaining "Write" operation of information of the semiconductor device.

Next, the operation of the semiconductor device described above will be described. First, "Write" operation will be described. As shown in FIG. 18, the memory gate electrode NGE of the memory transistor MTR in the selected bit is applied with 8.0 V, the select gate electrode SGE of the select transistor STR is applied with −2.5 V, the wiring WB (bit line) is applied with −2.5 V, the wiring WS (source line) is applied with 0 V, and the well region PWR is applied with −2.5 V.

As a result, a positive bias is applied to the memory gate electrode NGE of the memory transistor MTR, and an electron as an information is injected from the well region PWR to which the negative bias is applied toward the charge storage layer (silicon nitride film NI) in the memory-gate insulating film NOX. In this way, information is written to the selected bit.

Figure 19:
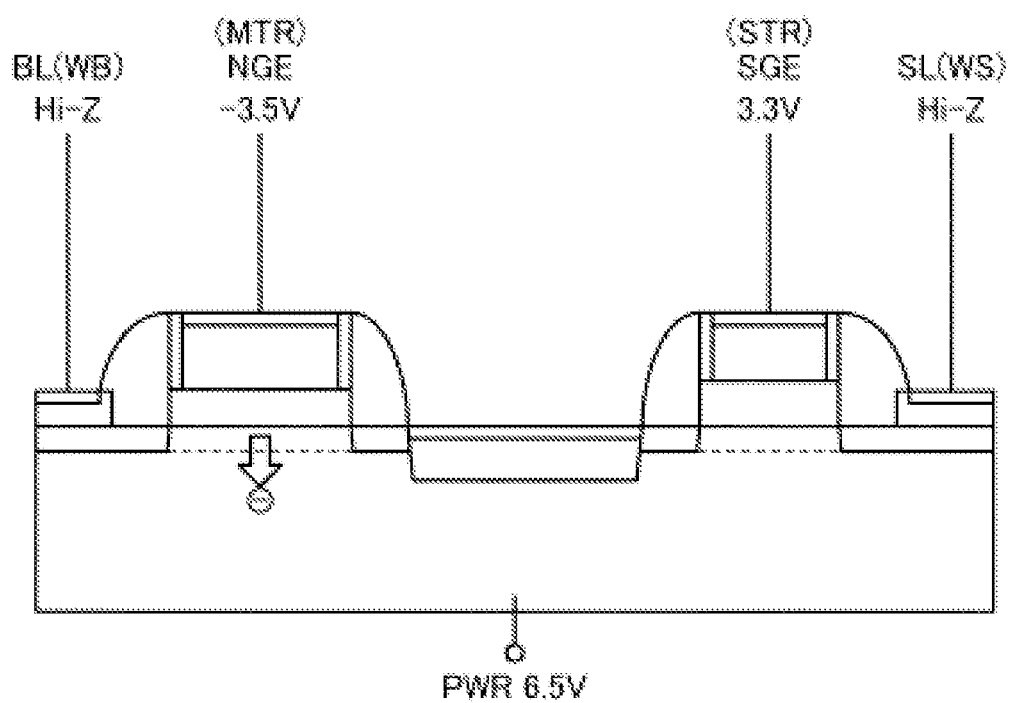
FIG. 19 is, in the first embodiment, a diagram for explaining "Erase" operation of information of the semiconductor device.

Next, "Erase" operation will be described. As shown in FIG. 19, the memory gate electrode NGE of the memory transistor MTR in the selected bit is applied with −3.5 V, the select gate electrode SGE of the select transistor STR is applied with 3.3 V, the well region PWR is applied with 6.5 V, and each of the wiring WB (bit line) and the wiring WS (source line) is brought into a high-impedance (Hi-Z) state. The high-impedance state is a floating state.

As a result, a negative bias is applied to the memory gate electrode NGE of the memory transistor MTR, and the electron applied to the charge storage layer of the memory-gate insulating film NOX as the information is extracted toward the well region PWR to which the positive bias is applied. In this way, information is erased for the selected bits.

Figure 20:
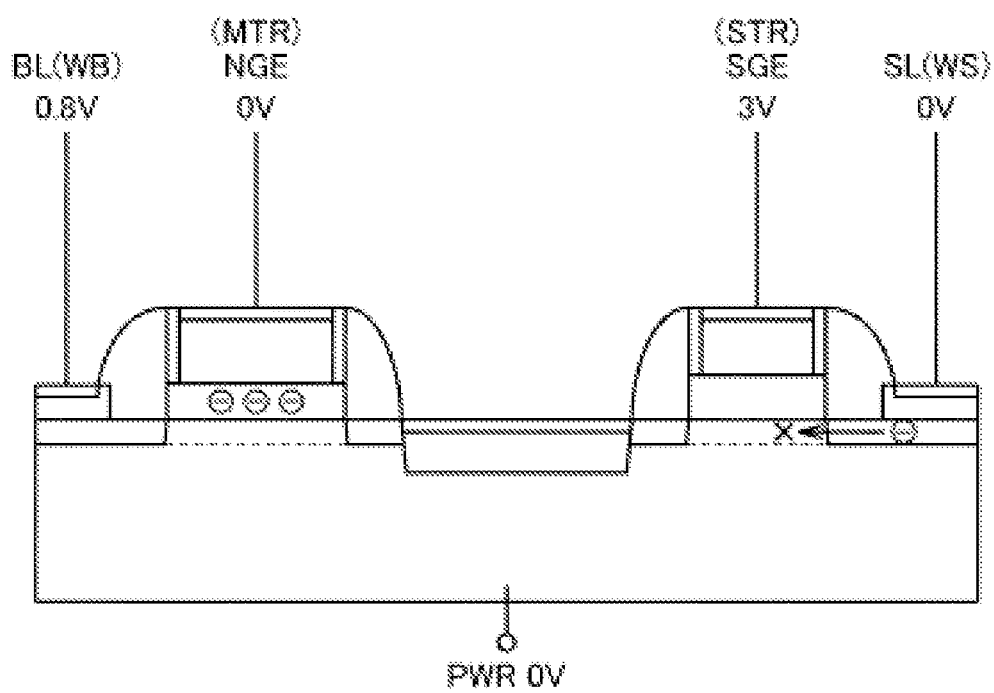
FIG. 20 is, in the first embodiment, a first diagram for explaining "Read" operation of information of the semiconductor device.

Next, "Read" operation will be described. First, a case where information is written in a selected bit will be described. As shown in FIG. 20, the memory gate electrode NGE of the memory transistor MTR in the selected bit is applied with 0 V, the select gate electrode SGE of the select transistor STR is applied with 3 V, the wiring WB (bit line) is applied with 0.8 V, the wiring WS (source line) is applied with 0 V, and the well region PWR is applied with 0 V.

The threshold voltage of the memory transistor MTR is higher than the reference potential by injecting the charge storage layer of the memory transistor MTR. Therefore, a current lower than the reference current flows or no current flows from the wiring WS (source line) side toward the wiring WB (bit line) side. That is, when a current lower than the reference current flows, the selected bit is determined as a write cell in which information is written.

Figure 21:
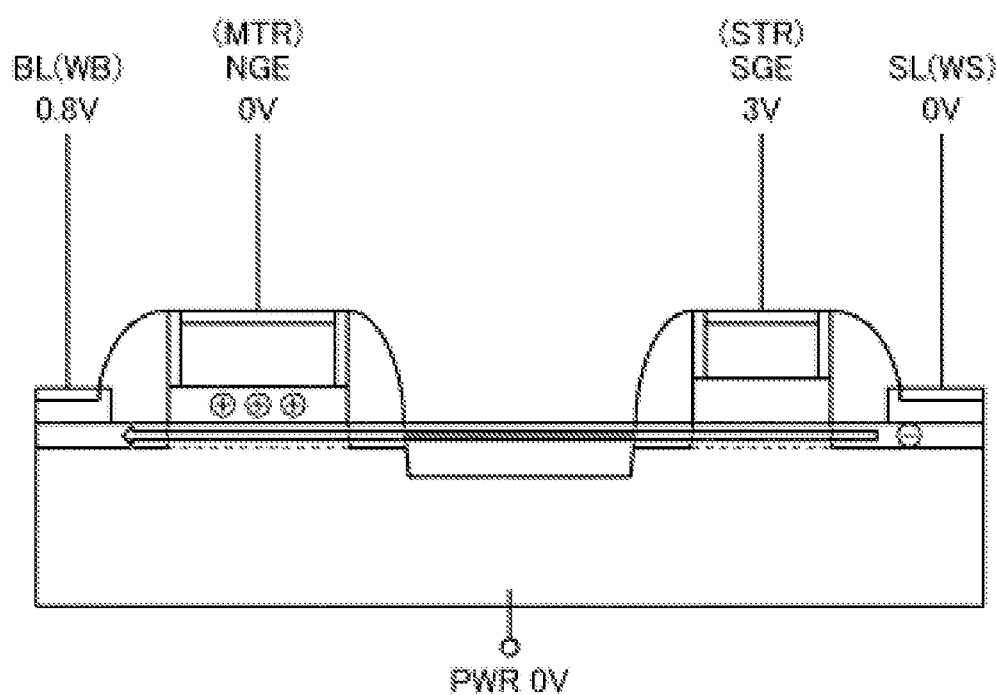
FIG. 21 is, in the first embodiment, a second diagram for explaining "Read" operation of information of the semiconductor device.

Next, a case where information is not written in the selected bit will be described. As shown in FIG. 21, the memory gate electrode NGE of the memory transistor MTR in the selected bit is applied with 0 V, the select gate electrode SGE of the select transistor STR is applied with 3 V, the wiring WB (bit line) is applied with 0.8 V, the wiring WS (source line) is applied with 0 V, and the well region PWR is applied with 0 V.

In this case, the threshold voltage of the memory transistor MTR is lower than the reference potential because the electron is not injected into the charge storage layer of the memory transistor MTR. Therefore, a current higher than the reference current flows from the wiring WS (source line) side toward the wiring WB (bit line) side. That is, when a current higher than the reference current flows, the selected bit is determined to be an erased cell in which no information is written.

As described above, during the read operation of the information, a current flows from the wiring WS (source line) side toward the wiring WB (bit line) side, but at that time, the current flows between the memory transistor MTR and the select transistor STR.

In the semiconductor device described above, the non-raised portion HEL in which the raising epitaxial layers are not formed is located in the memory-region first portion BNR1 between the memory transistor MTR and the select transistor STR. As a result, it is possible to suppress erroneous determination in which the erase cell is determined as a write cell as compared with a case where the raised epitaxial layer is formed. This will be explained.

Figure 22:
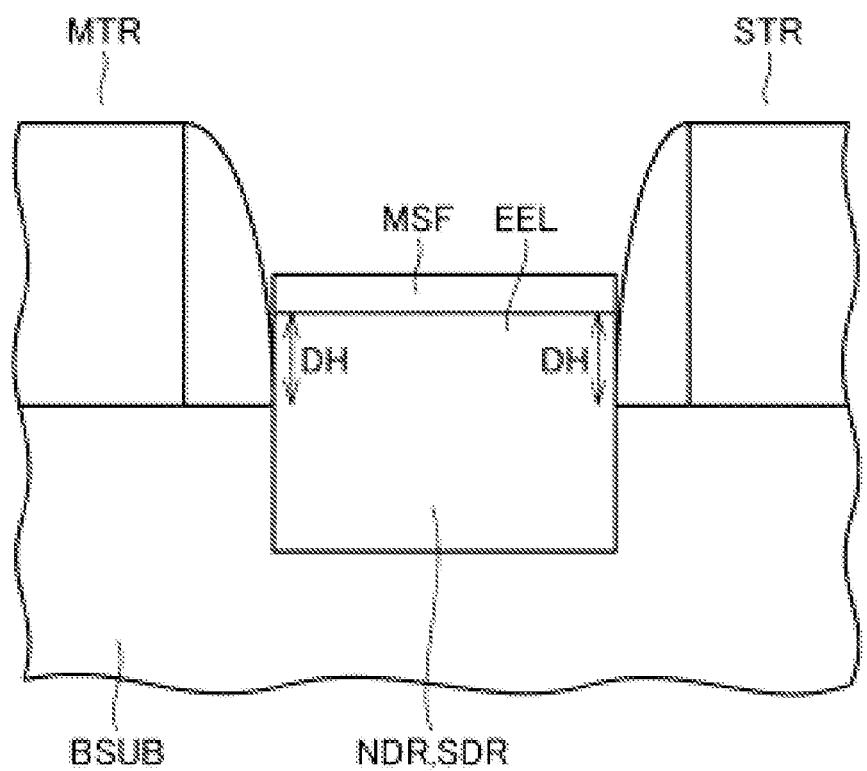
FIG. 22 is a partial enlarged cross-sectional view schematically showing a structure of a semiconductor device according to a comparative embodiment.

First, a semiconductor device according to a comparative embodiment will be described. As shown in FIG. 22, in the semiconductor device according to the comparative example, a raised epitaxial layer EEL is formed between the memory transistor MTR and the select transistor STR. In the raised epitaxial layer EEL, a first diffusion layer NDR of the memory transistor and a second diffusion layer SDR of the select transistor STR are formed.

The first diffusion layer NDR and the second diffusion layer SDR are formed by implanting n-type impurities from the top surface of the raised epitaxial layer EEL. The n-type impurity is diffused from the surface of the raised epitaxial layer EEL to a depth of, for example, about 50 nm, but the region having a relatively high n-type impurity concentration is considered to be from the surface of the raised epitaxial layer EEL to a depth of, for example, about 30 nm.

Considering that the metal silicide film MSF is formed in the surface of the raised epitaxial layer EEL, it is considered that the depth DH of the region having a relatively high n-type impurity concentration, in the raised epitaxial layer EEL, is about 20 nm. As a result, in the raised epitaxial layer EEL, the n-type impurity concentration is low at a position (depth) corresponding to the surface of the silicon substrate BSUB.

Figure 23:
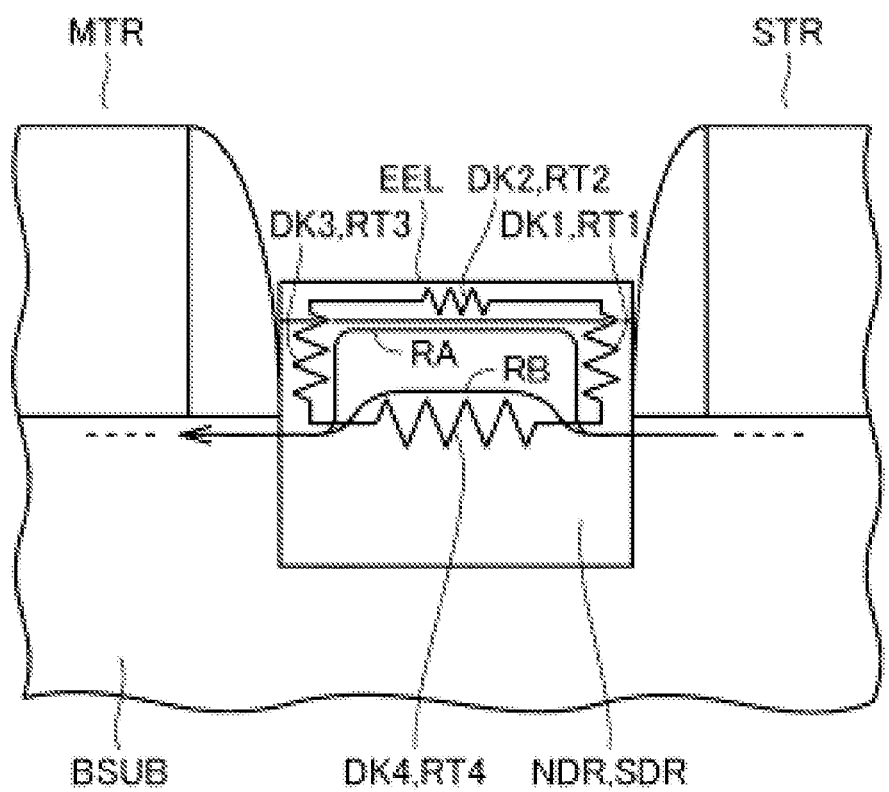
FIG. 23 is a partial enlarged cross-sectional view for explaining a flow of current in "Read" operation of the semiconductor device according to the comparative example.

As shown in FIG. 23, in the semiconductor device according to the comparative example, a current path RA and a current path RB are formed as a path of a current flowing between the memory transistor MTR and the select transistor STR during an information-reading operation.

The current path RA includes a path DK1 flowing from the sur face of the silicon substrate BSUB to the metal silicide film MSF, a path DK2 flowing through the metal silicide film MSF, and a path DK3 flowing from the metal silicide film MSF to the surface of the silicon substrate BSUB. The current path RB is composed of a path DK4 flowing through a part of the raised epitaxial layers EEL located at approximately the same height as the top surface of the silicon substrate BSUB.

Here, assuming that the path DK1 has the resistance RT1, the path DK2 has the resistance RT2, and the path DK3 has the resistance RT3, the resistance of the current path RA is the sum of the resistance RT1, the resistance RT2, and the resistance DK1. The resistance of the current path RB becomes the resistance RT4 of the path DK4. As described above, in the step of forming each of the low-concentration region and the high-concentration region, impurities are implanted into the surface of the object such as the silicon substrate or the thin-up epitaxial layer. That is, impurities are implanted from the surface of the direction epitaxial layers EEL toward the surface of the silicon substrate BSUB.

Therefore, in the thickness direction of the raised epitaxial layer EEL, the impurity concentration of the region close to the surface of the raised epitaxial layer EEL is relatively high, while the impurity concentration of the region far from the surface of the raised epitaxial layer EEL is relatively low. As a result, the resistor RT4 in the region far from the top surface of the raised epitaxial layers EEL becomes the highest among the resistivity RT1 and the resistivity RT4. The resistance of the current path flowing between the memory transistor MTR and the select transistor STR is a combined resistance in which the resistance of the current path RA and the resistance of the current path RB are connected in parallel.

Figure 24:
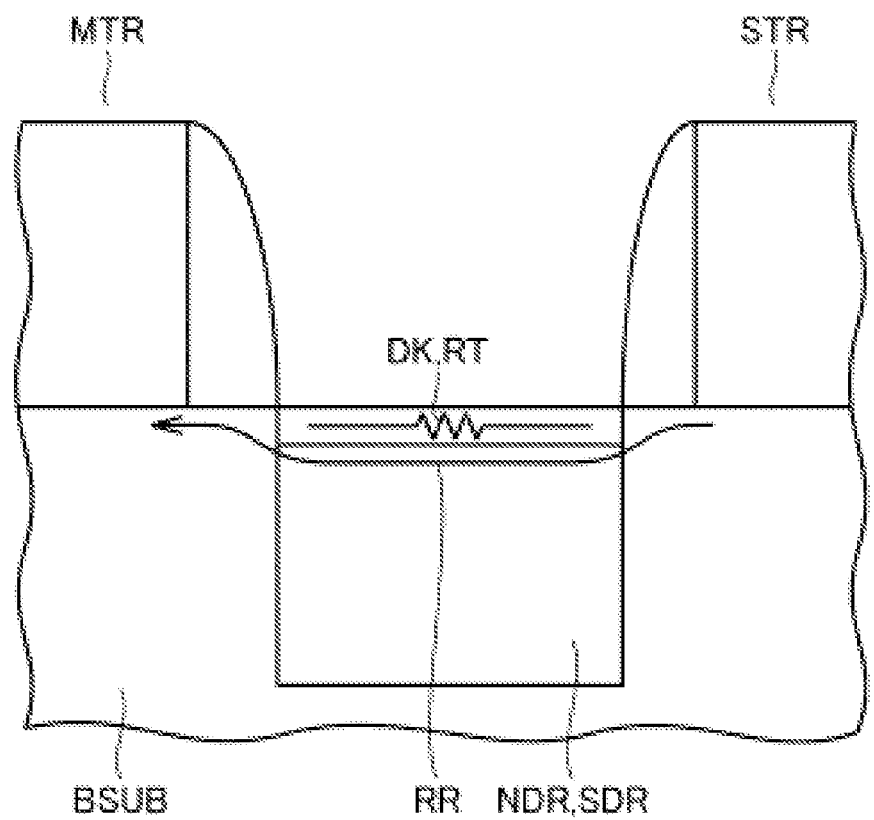
FIG. 24 is a partial enlarged cross-sectional view for explaining a flow of current in "Read" operation of the semiconductor device according to the first example.

Therefore, the raised epitaxial layers EEL are not formed, and the resistor of the current path between the memory transistor MTR and the select transistor STR is higher than that in the case where the current path is substantially only the path DK2 (refer to FIG. 24). Then, in the semiconductor device according to the comparative example, a current hardly flows between the memory transistor MTR and the select transistor STR during the read operation.

As described above, in the read operation, when a current higher than the reference current flows, the selected bit is determined to be an erase cell in which no information is written. On the other hand, when a current lower than the reference current flows, the selected bit is determined as a write cell in which information is written.

When a current hardly flows between the memory transistor MTR and the select transistor STR, there is a possibility that a current to be originally flown from the wiring WS (source line) toward the wiring WB (bit line) is hardly flowed. Therefore, in particular, in a case where a current lower than the reference current flows, the selected bit may be erroneously determined to be a write cell despite being an erase cell.

In the semiconductor device according to the first embodiment with respect to semiconductor device according to the comparative example, the non-raised portion HEL in which the raising epitaxial layers are not formed is located in the memory-region first portion BNR1 between the memory transistor MTR and the select transistor STR.

As shown in FIG. 24, in the semiconductor device according to the first embodiment, a current path RR is formed as a path of a current flowing between the memory transistor MTR and the select transistor STR during an information-reading operation. The current path RR is mainly comprised of a path DK that flows through the metal silicide film MSF formed in the surface of the silicon substrate BSUB.

In addition, among the first-diffusion-layer first portion NDR1 and the first-diffusion-layer second portion NDR2 of the memory transistor, which are all high concentration regions, and the second-diffusion-layer first portion SDR1 and the second-diffusion-layer second portion SDR2 of the select transistor STR, the impurity concentration in a region close to the metal silicide film MSF (that is, a region that can be a part of the current path RR) is higher than the impurity concentration in a region far from the metal silicide film MSF. Therefore, the resistance DK of the path RT corresponds to the resistance RT2 of the path RT according to the comparative example (see FIG. 23).

Therefore, in the semiconductor device according to the first embodiment, the resistor RT of the current path RR (path DK) between the memory transistor MTR and the select transistor STR is lower than in the semiconductor device according to the comparative example. According to the inventors' evaluation, it was estimated that the resistor RT is less than or equal to half the resistance of the comparative example.

As a result, in the read operation, a current that should originally flow from the wiring WS (the source line) toward the wiring WB (the bit line) easily flows. Therefore, in a case where a current lower than the reference current flows, it is possible to prevent the selected bit from being erroneously determined as a write cell even though the selected bit is originally an erase cell.

Next, the reason why the non-raised portion HEL in which the raised epitaxial layer is not formed is located in the memory-region first portion BNR1 and the first raised epitaxial layer NEL is formed in the memory-region second portion BNR2 will be briefly described.

Figure 25:
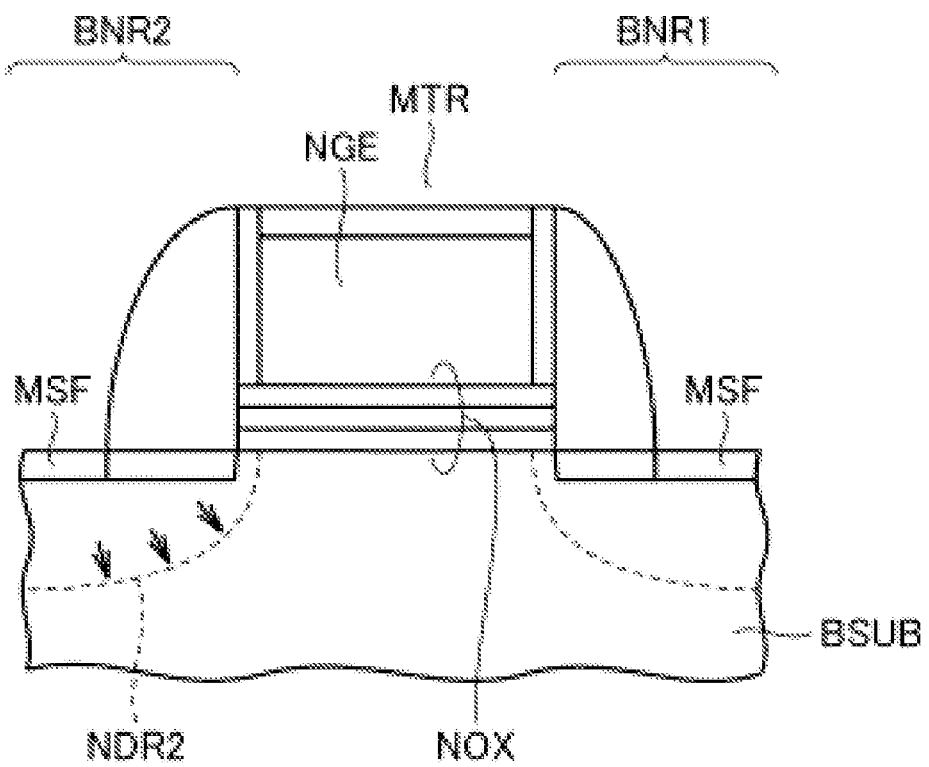
FIG. 25 is, in the first embodiment, a partial enlarged cross-sectional view for explaining a reason why a raised epitaxial layer is formed.

As shown in FIG. 25, when the first raised epitaxial layer NEL is not formed on the memory-region second portion BNR2, the second portion NDR2 of the first diffused layer is formed by implanting an n-type impurity from the top surface of the silicon substrate BSUB. The implanted impurities diffuse not only in their surrounding, i.e. in the thickness direction, but also in the lateral direction. Therefore, the n-type impurity of the implanted first diffusion layer second portion NDR2 is likely to diffuse to an area immediately below the memory gate electrode NGE. This may shorten the effective gate length of the memory transistor MTR. When the effective gate length is shortened, the short-channel property may be deteriorated when semiconductor device is miniaturized. In addition, there is a possibility that a malfunction in which writing is erroneously performed may occur.

In the semiconductor device according to the first embodiment, as shown in FIG. 14, a first raised epitaxial layer NEL is formed on the memory-region second portion BNR2, and an n-type impurity is implanted from the top surface of the first raised epitaxial layer NEL to form the second portion NDR2 of the first diffused layer. Accordingly, it is possible to prevent the n-type impurity in the second portion NDR2 of the first diffusion layer from diffusing to the region immediately below the memory gate electrode NGE, and it is possible to suppress deterioration or malfunction of the short-channel property.

Second Embodiment

Here, a second example of the manufacturing method of the semiconductor device described above will be described. Note that the same reference numerals are given to the same members as those of semiconductor device according to the first embodiment, and the explanation thereof will not be repeated unless otherwise required.

Figure 26:
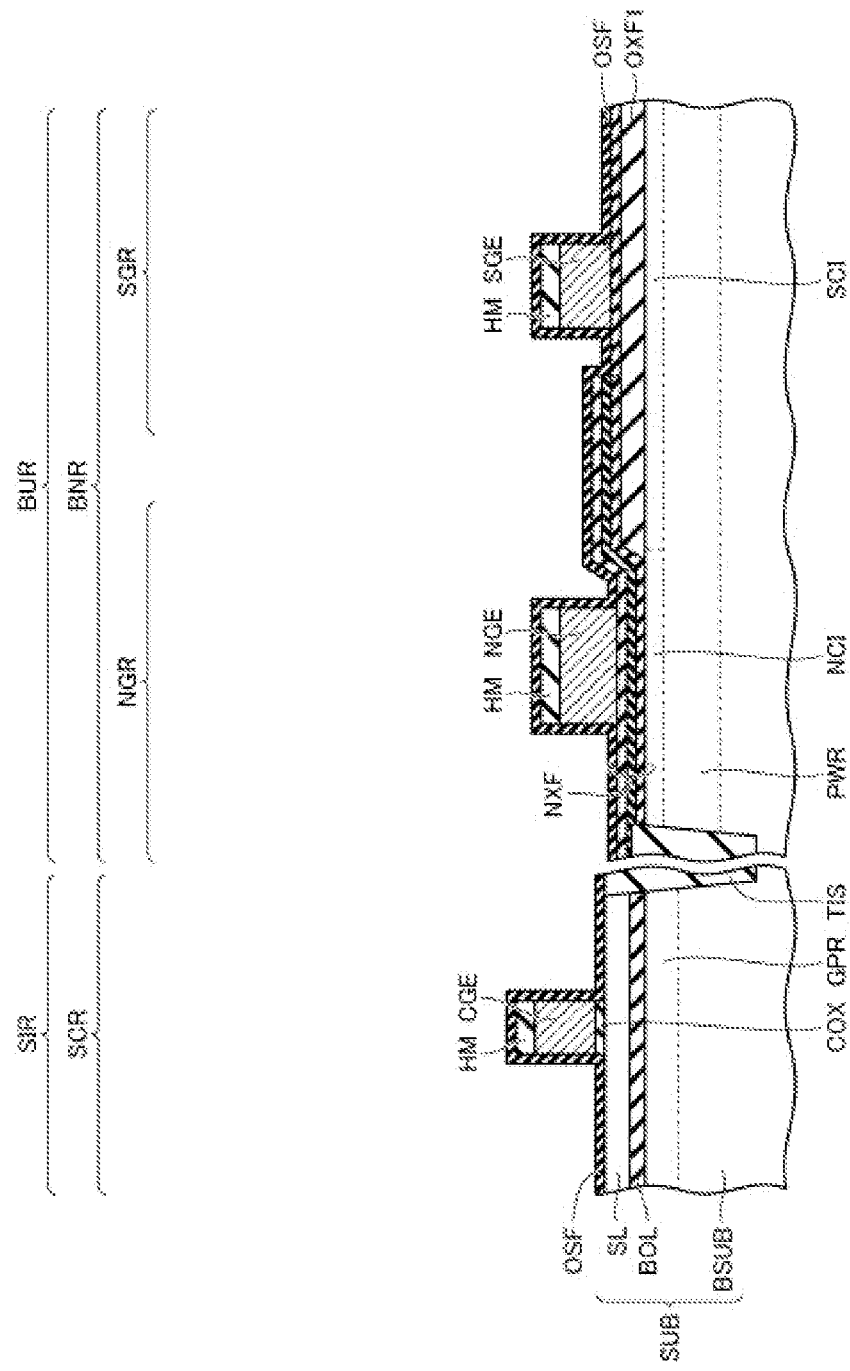
FIG. 26 is a cross-sectional view showing a step of a manufacturing method of a semiconductor device according to a second embodiment.

As shown in FIG. 26, an offset spacer film OSF is formed to cover the memory gate electrode NGE, the select gate electrode SGE, and the gate electrode CGE through the same steps as those shown in FIGS. 2 to 9 described above.

Figure 27:
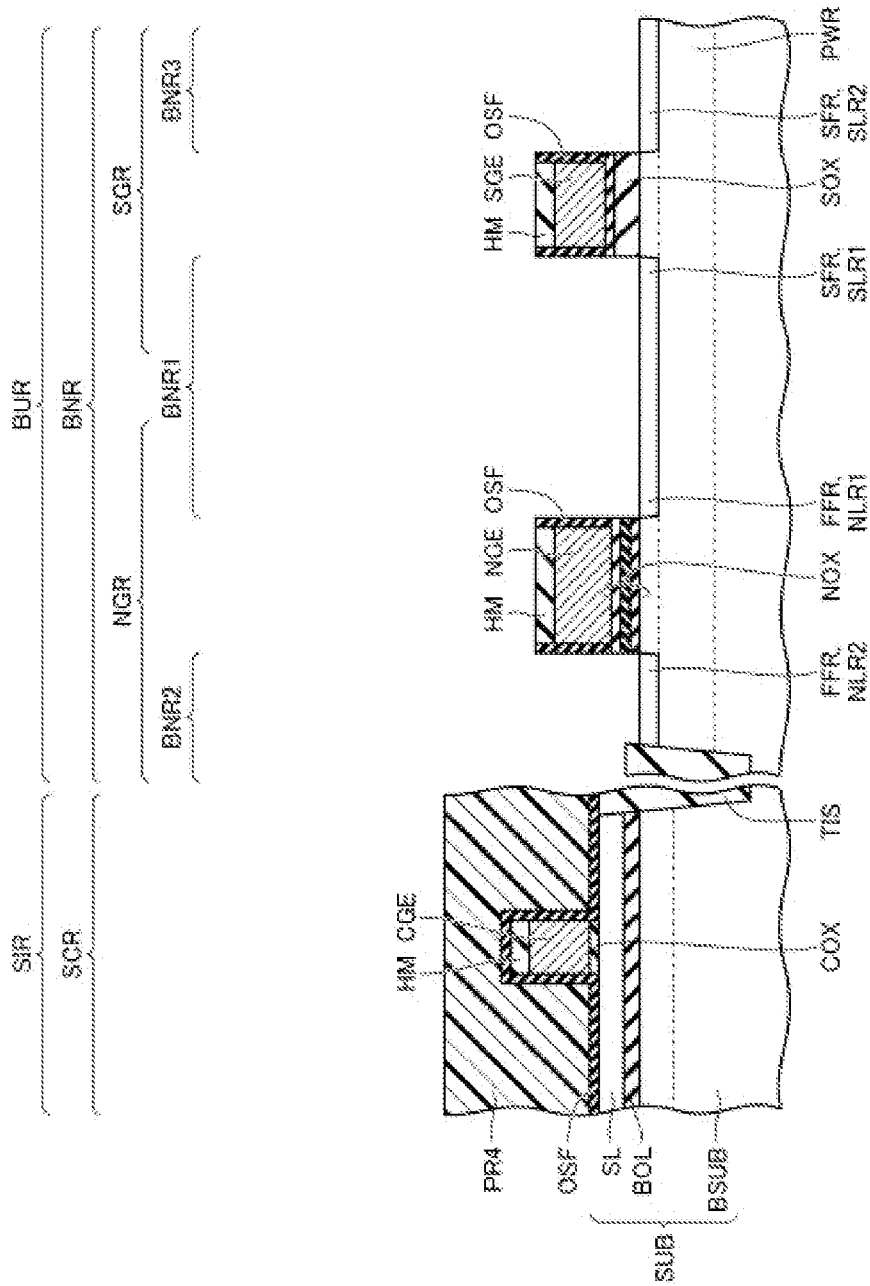
FIG. 27 is, in the second embodiment, a cross-sectional view showing a step to be performed after the step shown in FIG. 26.

Next, as shown in FIG. 27, by performing a predetermined photoengraving process, a photoresist pattern PR4 covering SOI regions SIR and exposing the bulk-regions BUR is formed. Next, an etching process is performed using the photoresist pattern PR4 as an etching mask. At this time, an etch process is performed so as to expose the region surface of the silicon substrate BSUB located on the memory-region first portion BNR1.

Next, an ion implantation process is performed in the same manner as the process shown in FIG. 10. Thus, in the memory-region first portion BNR1, the first-LDD-diffusion-layer first portion NLR1 and the second-LDD-diffusion-layer first portion SLR1 are formed. In the memory-region second portion BNR2, the first-LDD-diffusion-layer second portion NLR2 is formed. In the memory-region third portion BNR3, the second-LDD-diffusion-layer second portion SLR2 is formed. Thereafter, the photoresist pattern PR4 is removed.

Next, a silicon oxide film TSFF (see FIG. 28) is formed so as to cover the memory gate electrode NGE, the select gate electrode SGE, and the gate electrode CGE. Next, by performing a predetermined photoengraving process, a photoresist pattern PR6 (see FIG. 28) that covers the silicon oxide film TSFF located on the memory-region first portion BNR1 and exposes other regions is formed.

Figure 28:
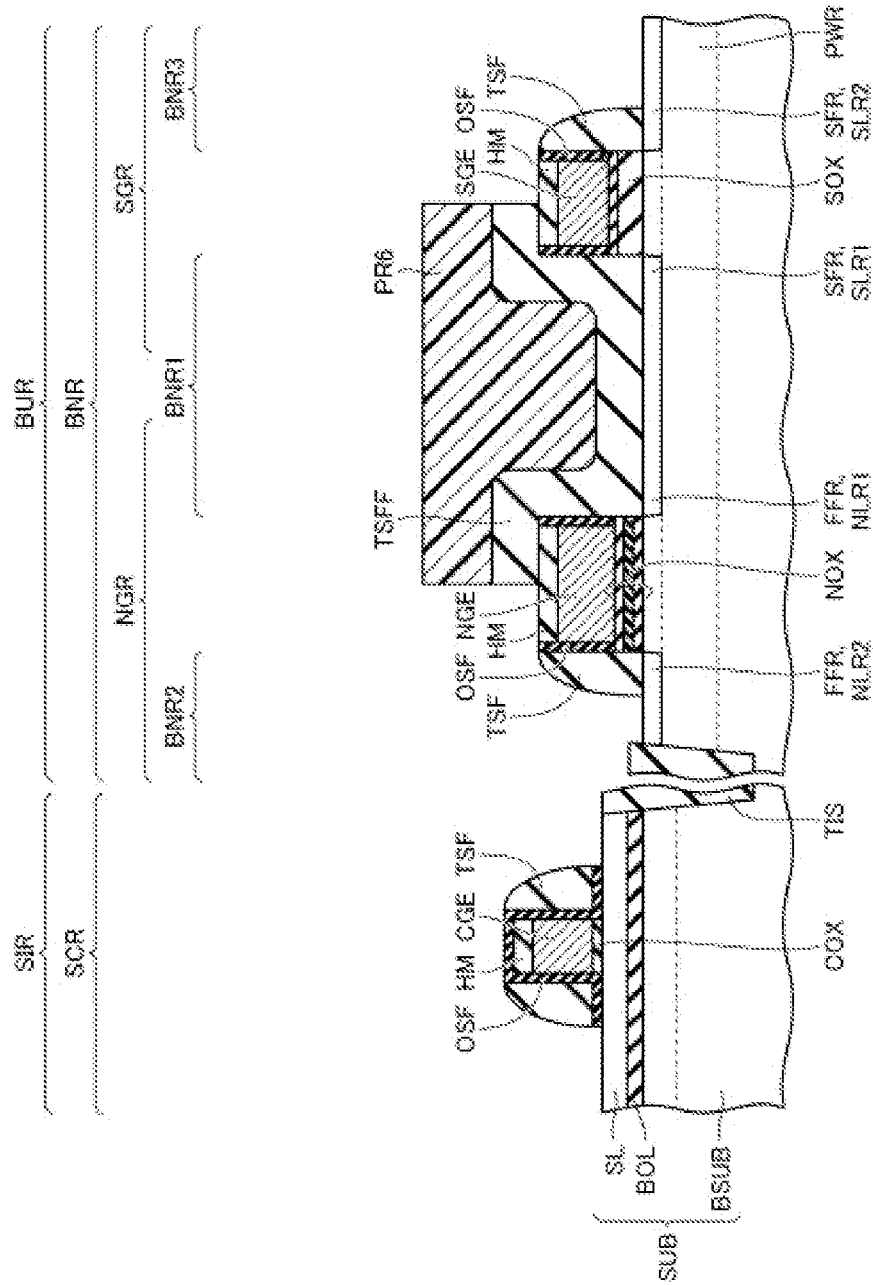
FIG. 28 is, in the second embodiment, a cross-sectional view showing a step to be performed after the step shown in FIG. 27.

Next, as shown in FIG. 28, an etching process is performed on the silicon oxide film TSFF using the photoresist pattern PR6 as an etching mask. As a result, the spacer film TSF is formed on one side surface of the memory gate electrode NGE. A spacer film TSF is formed on one side surface of the select-gate-electrode SGE. A spacer film TSF is formed on each of both side surfaces of the gate-electrode CGE. In the memory-region first portion BNR1, the silicon substrate BSUB is covered with the silicon oxide film TSFF. Thereafter, the photoresist pattern PR6 is removed.

Figure 29:
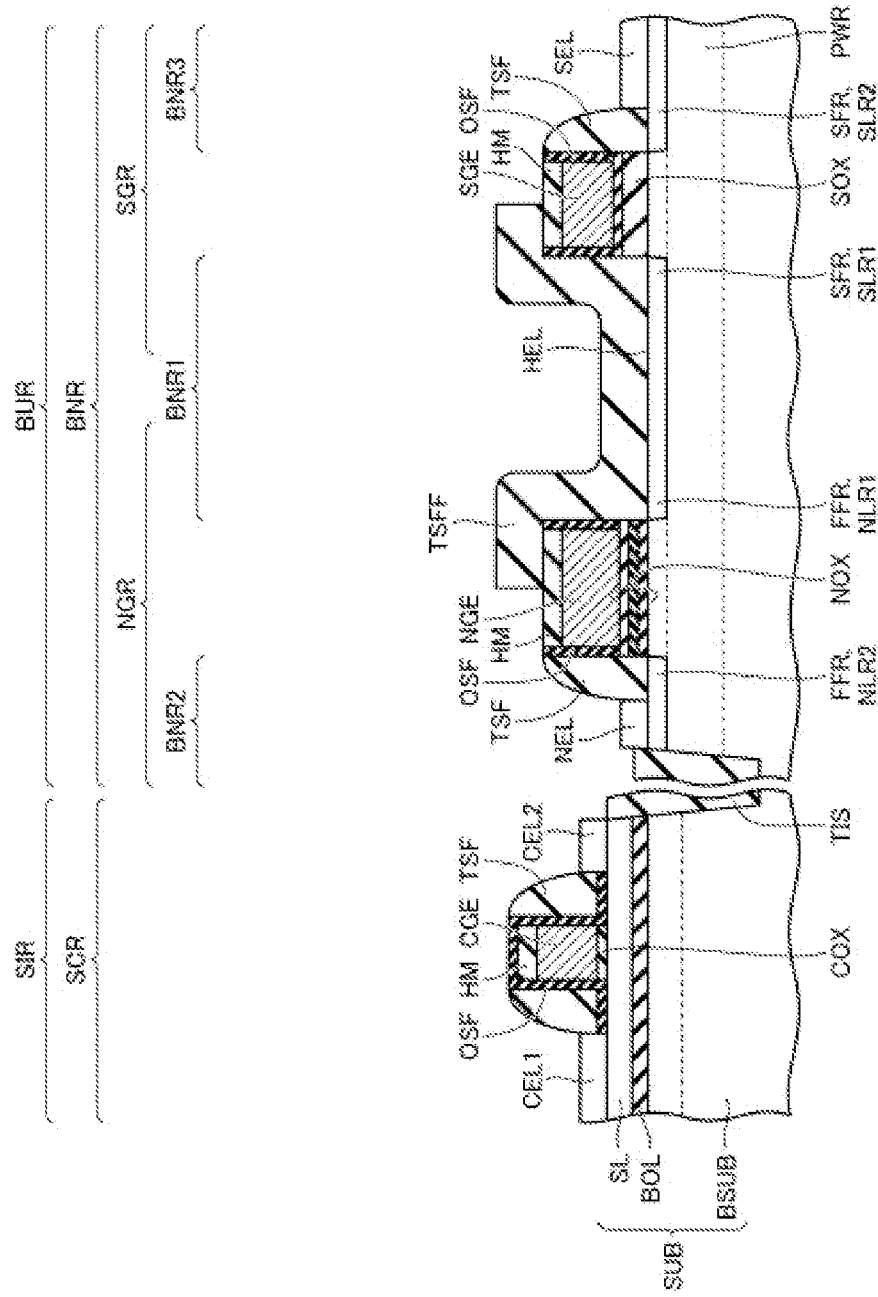
FIG. 29 is, in the second embodiment, a cross-sectional view showing a step to be performed after the step shown in FIG. 28.

Next, as shown in FIG. 29, an epitaxial growth of silicon is performed on the surface of the exposed silicon substrate BSUB or the like by an epitaxial growth method. In the memory-region second portion BNR2, the first raised epitaxial layer NEL is formed in the surface of the silicon substrate BSUB. In the memory-region third portion BNR3, the second raised epitaxial layer SEL is formed in the surface of the silicon substrate BSUB.

In SOI area SIR, the third raised epitaxial layer CEL1 and the fourth raised epitaxial layer CEL2 are formed on the silicon layer SL. On the other hand, in the memory-region first portion BNR1, since the silicon substrate BSUB is covered with the silicon oxide film TSFF, epitaxial growth of silicon is not performed.

Figure 30:
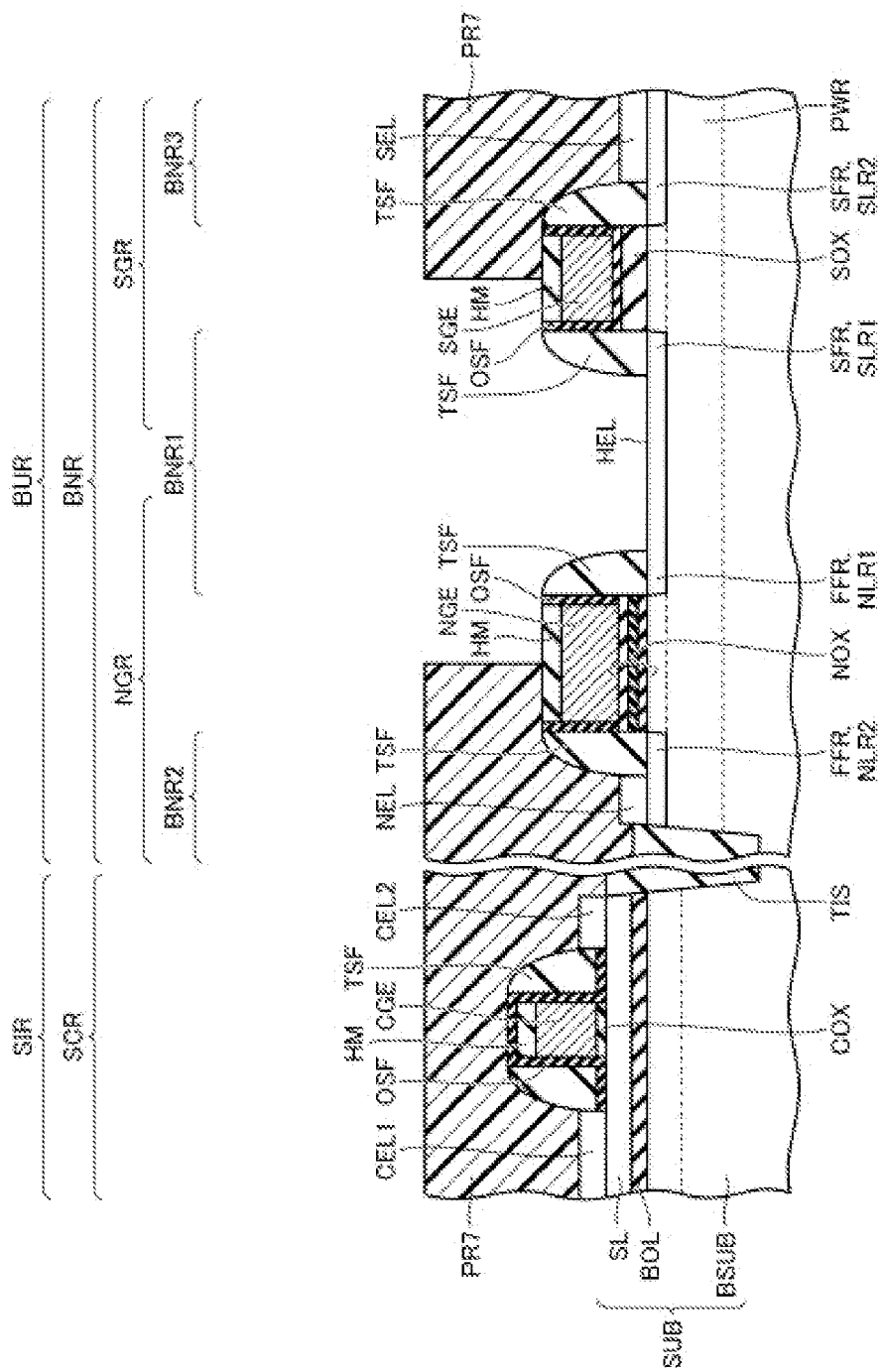
FIG. 30 is, in the second embodiment, a cross-sectional view showing a step to be performed after the step shown in FIG. 29.

Next, by performing a predetermined photoengraving process, a photoresist pattern PR7 (see FIG. 30) is formed which exposes the memory-region first portion BNR1 and covers other regions. Next, as shown in FIG. 30, the silicon oxide film TSFF is etched using the photoresist pattern PR7 as an etching mask, whereby the silicon oxide film TSFF is removed to expose the silicon substrate BSUB located on the memory-region first portion BNR1.

At this time, the spacer film TSF is formed in each of the memory gate electrode NGE and the select gate electrode SGE. Thereafter, the photoresist pattern PR7 is removed. Next, for example, the spacer film TSF or the like is removed by performing a wet etching process.

Figure 31:
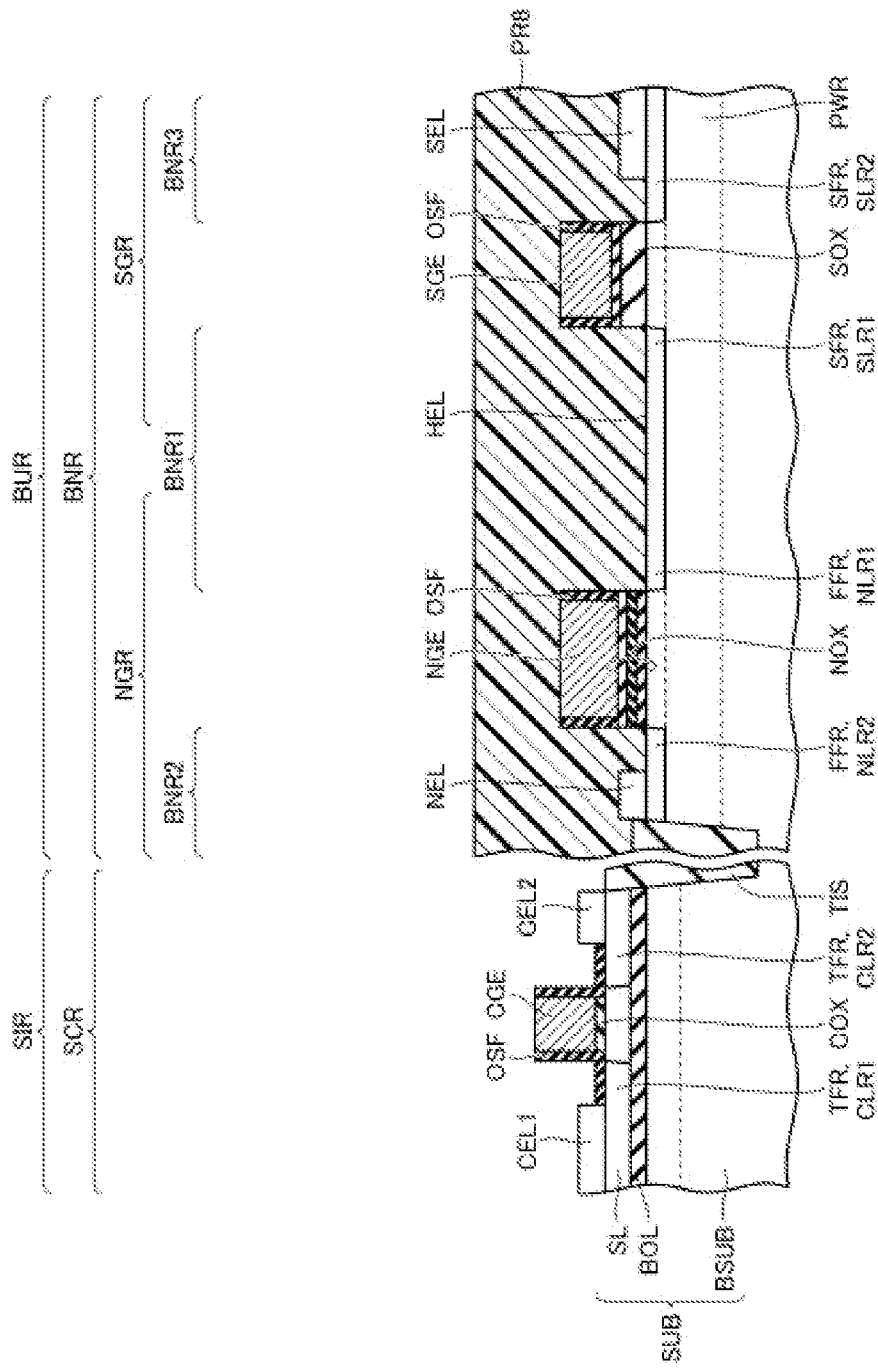
FIG. 31 is, in the second embodiment, a cross-sectional view showing a step to be performed after the step shown in FIG. 30.

Next, as shown in FIG. 31, by performing a predetermined photoengraving process, a photoresist pattern PR8 that covers the bulk-region BUR and exposes SOI region SIR is formed. Next, using the gate electrode CGE and the photoresist pattern PR8 as an implantation mask, for example, an n-type impurity is implanted to form the third-LDD-diffusion-layer first portion CLR1 and the third-LDD-diffusion-layer second portion CLR2 in the silicon layer SL. Thereafter, the photoresist pattern PR8 is removed.

Figure 32:
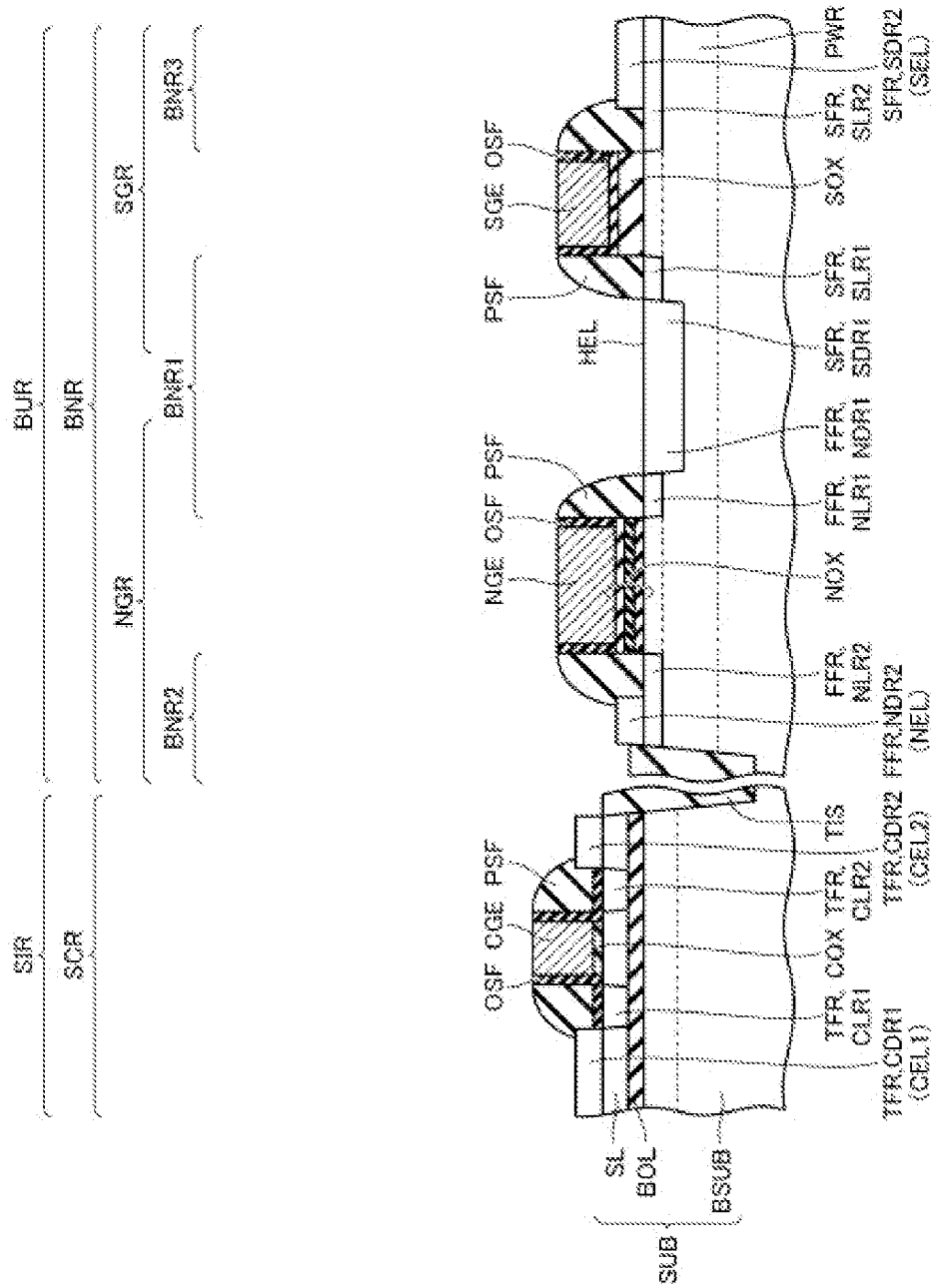
FIG. 32 is, in the second embodiment, a cross-sectional view showing a step to be performed after the step shown in FIG. 31.

Next, as shown in FIG. 32, a spacer film PSF is formed on each side surface of the memory gate electrode NGE, the select gate electrode SGE, the gate electrode CGE, and the like. Next, by performing a predetermined photoengraving process, a photoresist pattern (not shown) that covers SOI regions SIR and exposes the bulk-regions BUR is formed.

Next, for example, n-type impurities are implanted using the photoresist pattern, the memory gate electrode NGE, the select gate electrode SGE, and the like as an implantation mass. By this implantation process, the first-diffusion-layer first portion NDR1 and the second-diffusion-layer first portion SDR1 are formed in the memory-region first portion BNR1. In the memory-region second portion BNR2, the first diffusion-layer second part NDR2 is formed. In the memory-region third portion BNR3, the second-diffusion-layer second portion SDR2 is formed. Thereafter, the photoresist pattern is removed.

Next, by performing a predetermined photoengraving process, a photoresist pattern (not shown) that covers the bulk-region BUR and exposes SOI region SIR is formed. Next, for example, n-type impurities are implanted using the photoresist pattern, the electrode CGE, and the like as an implantation mass. By this implantation process, the third-diffusion-layer first portion CDR1 is formed on the third raised epitaxial layer CEL1 or the like. The third-diffusion-layer second portion CDR2 is formed on the fourth raised epitaxial layer CEL2 or the like. Thereafter, the photoresist pattern is removed.

Figure 33:
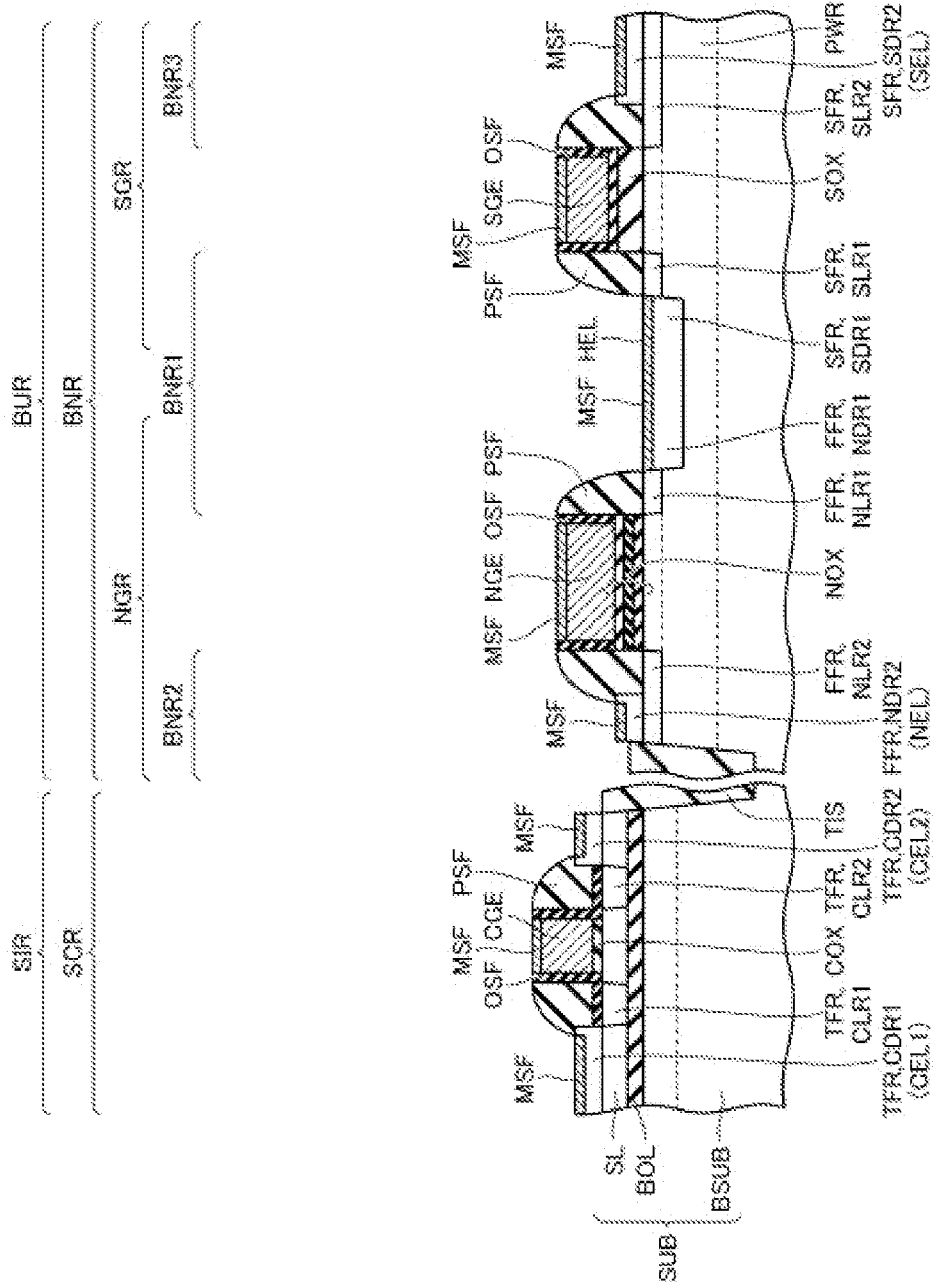
FIG. 33 is, in the second embodiment, a cross-sectional view showing a step to be performed after the step shown in FIG. 32.

Next, as shown in FIG. 33, a metal silicide film MSF such as nickel silicide is formed by the salicide method. In the memory-region first portion BNR1, a metal silicide film MSF is formed in the surface of the silicon substrate BSUB (the first-diffusion-layer first portion NDR1 of the first diffusion layer and the second-diffusion-layer first portion SDR1 of the second diffusion layer). In the memory-region second portion BNR2, a metal silicide film MSF is formed in the surface of the first raised epitaxial layer NEL. In the memory-region third portion BNR3, a metal silicide film MSF is formed in the surface of the second surface epitaxial layer SEL. In addition, a metal silicide film MSF is formed in the upper surface of the memory gate electrode NGE. A metal silicide film MSF is formed in the upper surface of the select gate electrode SGE.

Figure 34:
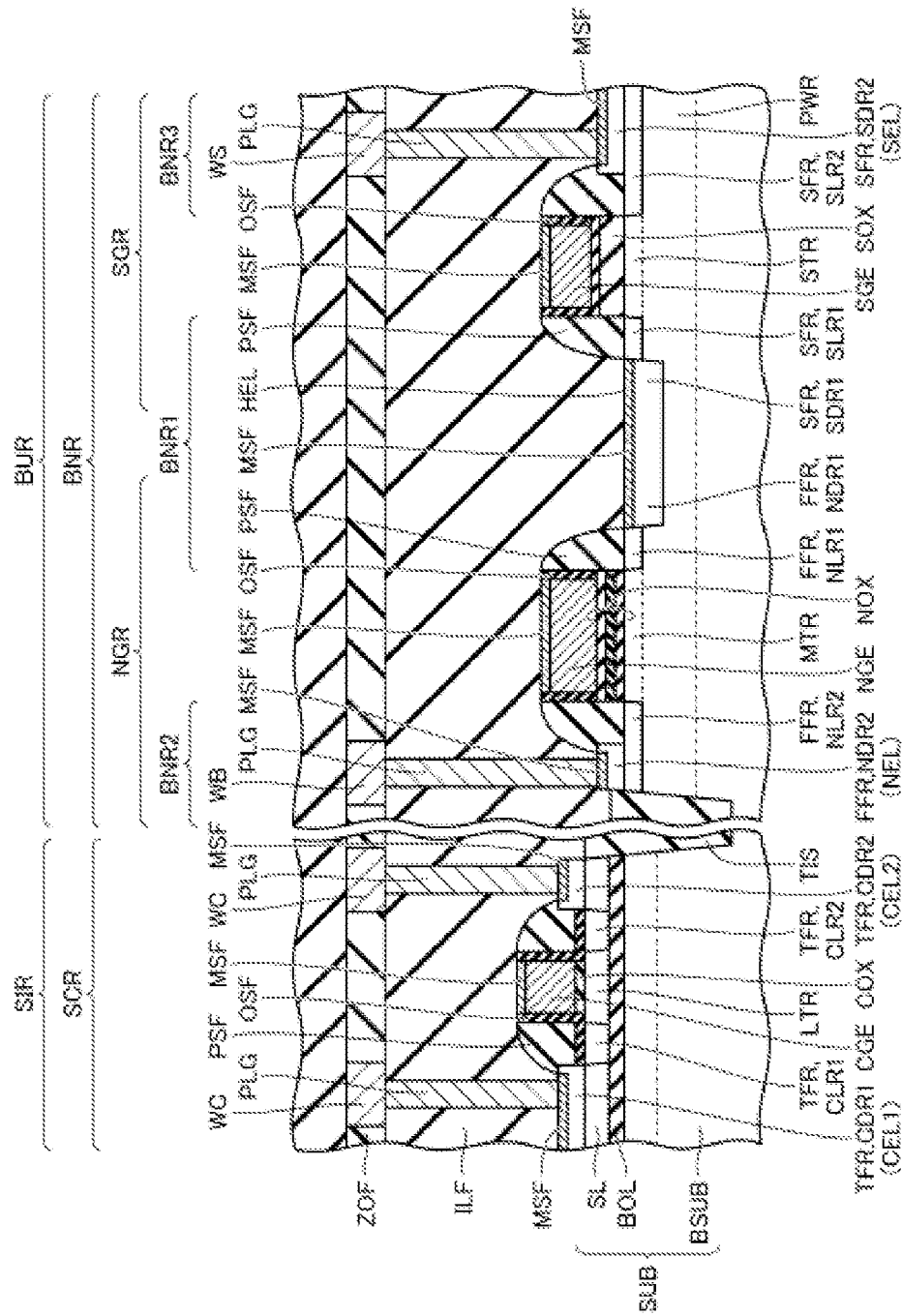
FIG. 34 is, in the second embodiment, a cross-sectional view showing a step to be performed after the step shown in FIG. 33.

Next, as in the step shown in FIG. 17, an interlayer insulating film ILF is formed. Next, a plugging PLUGS PLG penetrating through the interlayer insulating film ILF and reaching the respective metal silicide films MSF is formed. Next, an insulating film ZOF is formed so as to cover the interlayer insulating film ILF. A wiring WB, a wiring WC, and a wiring WC are formed on the insulating film ZOF by, for example, a damascene method. Thereafter, an upper wire (not shown) is formed to complete semiconductor device as shown in FIG. 34. Semiconductor device is shown in FIG. 1 and forms a semiconductor device similar to that of the semiconductor device.

In the semiconductor device described above, as in the semiconductor device described above, in the memory region BNR, the non-raised portion HEL in which the epitaxial layers are not formed is positioned on the memory-region first portion BNR1. As a result, as described in the first embodiment, in the read operation, a current that should originally flow easily flows from the wiring WS (source line) toward the wiring WB (bit line). Therefore, in a case where a current lower than the reference current flows, it is possible to prevent the selected bit from being erroneously determined as a write cell even though the selected bit is originally an erase cell.

In the above-described embodiments, a configuration has been described in which a memory transistor MTR as a semiconductor element and a select transistor STR as a semiconductor element are formed in a memory region BNR in the bulk region BUR, but a high breakdown voltage MOS transistor may be further formed as a semiconductor element in a region other than the memory region BNR in the bulk region BUR.

The semiconductor device described in the respective embodiments can be variously combined as required.

Although the invention made by the present inventor has been specifically described based on the embodiment, the present invention is not limited to the embodiment described above, and it is needless to say that various modifications can be made without departing from the gist thereof.

What is claimed is:
1. A semiconductor device including a semiconductor element including a memory transistor and a select transistor, comprising:
a semiconductor substrate including a semiconductor-supporting substrate;
an element region defined in the semiconductor substrate, the element region including a first element region defined in the semiconductor-supporting substrate; and
the semiconductor element formed in the element region, the semiconductor element including the memory transistor and the select transistor that are electrically coupled in series, the memory transistor and the select transistor being formed in the first element region so as to be spaced apart from each other,
wherein the memory transistor has:
a memory-gate insulating film formed on a surface of the semiconductor-supporting substrate located in the first element region and including a charge storage layer;
a memory gate electrode formed on the memory-gate insulating film; and
a first impurity region including a first-impurity-region first portion and a first-impurity-region second portion,
wherein the select transistor has:
a select-gate insulating film formed on the surface of the semiconductor-supporting substrate located in the first element region;
a select gate electrode formed on the select-gate insulating film; and
a second impurity region including a second-impurity-region first portion and a second-impurity-region second portion,
wherein the first element region includes:
a first-element-region first portion defined in the semi-conductor-supporting substrate located between the memory gate electrode and the select gate electrode;
a first-element-region second portion defined in the semiconductor-supporting substrate located at opposite side of the select gate electrode with respect to the memory gate electrode; and
a first-element-region third portion defined in the semi-conductor-supporting substrate located at opposite side of the memory gate electrode with respect to the select gate electrode,
wherein, in the first-element-region second portion, a first raised portion is formed from the surface of the semi-conductor-supporting substrate to a position higher than the surface,
wherein, in the first-element-region third portion, a second raised portion is formed from the surface of the semiconductor-supporting substrate to a position higher than the surface,
wherein, in the element region, a raised portion including the first raised portion and the second raised portion is formed,
wherein the raised portion is not formed in the first-element-region first portion, and each of the first-impurity-region first portion and the second-impurity-region first portion is formed in the first-element-region first portion in which the raised portion is not formed,
wherein the first-impurity-region second portion is formed in the first-element-region second portion so as to include the first raised portion, wherein the second-impurity-region second portion is formed in the first-element-region third portion so as to include the second raised portion, and wherein in each of the first-impurity-region first portion, the first-impurity-region second portion, the second-impurity-region first portion and the second-impurity-region second portion, an impurity concentration of a region close to a surface thereof is higher than an impurity concentration of a region far away from the surface thereof.

2. The semiconductor device according to claim 1, wherein a first metal silicide film is formed in each of the first raised portion, the second raised portion, the first-element-region first portion in which the raised portion is not formed, the memory gate electrode and the select gate electrode.

3. The semiconductor device according to claim 1,
wherein the semiconductor substrate further includes:
an insulating film formed on the semiconductor-supporting substrate; and
a semiconductor layer formed on the insulating film,
wherein the element region includes a second element region defined in the semiconductor layer,
wherein the semiconductor element includes a transistor, which is different from each of the memory transistor and the select transistor, formed in the second element region, and
wherein the transistor has:
a gate electrode formed on a surface of the semiconductor layer located in the second element region via a gate insulating film, and
a third impurity region including a third-impurity-region first portion and a third-impurity-region second portion.

4. The semiconductor device according to claim 3,
wherein the raised portion includes:
a third raised portion formed on the surface of the semiconductor layer located on one side in a gate length direction of the gate electrode with respect to the gate electrode; and
a fourth raised portion formed on the surface of the semiconductor layer located on another side in the gate length direction of the gate electrode with respect to the gate electrode,
wherein the third-impurity-region first portion is formed so as to include the third raised portion, and
wherein the third-impurity-region second portion is formed so as to include the fourth raised portion.

5. The semiconductor device according to claim 4, wherein a second metal silicide film is formed in each of the third raised portion, the fourth raised portion and the gate electrode.

6. A method of manufacturing a semiconductor device including a semiconductor element including a memory transistor and a select transistor, comprising steps of:
(a) providing a semiconductor substrate including a semiconductor-supporting substrate;
(b) defining an element region in the semiconductor substrate, the step of (b) including a step of defining a first element region in the semiconductor-supporting substrate; and
(c) forming the semiconductor element in the element region, the step of (c) including a step of forming each of the memory transistor and the select transistor in the first element region, the memory transistor having a memory gate electrode, a first-impurity-region first portion and a first-impurity-region second portion, and the select transistor having a select gate electrode, a second-impurity-region first portion and a second-impurity-region second portion, wherein the step of forming each of the memory transistor and the select transistor includes:
(c1) in the first element region, forming the memory gate electrode and the select gate electrode so as to be spaced apart from each other;
(c2) in the first element region, forming a blocking film so as to cover a first-element-region first portion defined in the semiconductor-supporting substrate located between the memory gate electrode and the select gate electrode, the blocking film being a film for preventing an epitaxial growth;
(c3) in a state that the blocking film is formed, by an epitaxial growth method, forming a first raised portion at a first-element-region second portion defined in the semiconductor-supporting substrate located at opposite side of the select gate electrode with respect to the memory gate electrode, the first raised portion being formed from a surface of the semiconductor-supporting substrate to a position higher than the surface, and forming a second raised portion at a first-element-region third portion defined in the semiconductor-supporting substrate located at opposite side of the memory gate electrode with respect to the select gate electrode, the second raised portion being formed from the surface of the semiconductor-supporting substrate to a position higher than the surface; and
(c4) by implanting an impurity into each of the surface of the semiconductor-supporting substrate, a surface of the first raised portion and a surface of the second raised portion, forming each of the first-impurity-region first portion and the second-impurity-region first portion in the first-element-region first portion, forming the first-impurity-region second portion in the first-element-region second portion so as to include the first raised portion, and forming the second-impurity-region second portion in the first-element-region third portion so as to include the second raised portion.

7. The method according to claim 6,
wherein, before the step of (c1), the step of forming each of the memory transistor and the select transistor further includes:
(c5) forming a first insulating film so as to cover the surface of the semiconductor-supporting substrate located in the first element region, the first insulating film being to be a select-gate insulating film of the select transistor;
(c6) removing the first insulating film located in a memory transistor region in which the memory transistor is to be formed such that the first insulating film located in a select transistor region in which the select transistor is to be formed is left, and exposing the surface of the semiconductor-supporting substrate;
(c7) forming a second insulating film so as to cover each of the first insulating film which is left by performing the step of (c6) and the surface of the semiconductor-supporting substrate which is exposed by performing the step of (c6), the second insulating film being to be a memory-gate insulating film of the memory transistor; and
(c8) removing the second insulating film located in the select transistor region such that a portion, which is to be located between the select gate electrode and the memory gate electrode, of the second insulating film laminated so as to cover the first insulating film is left, and wherein the step of (c1) further includes:
  forming the memory gate electrode in the memory transistor region via the second insulating film; and
  forming the select gate electrode in the select transistor region via the first insulating film.

8. The method according to claim 7,
wherein the step of (c2) further includes:
  by performing an etching process to each of the second insulating film and the first insulating film by using each of the memory gate electrode and the select gate electrode as an etching mask, exposing the surface of the semiconductor-supporting substrate in each of the first-element-region second portion and the first-element-region third portion, and leaving the first insulating film covering the surface of the semiconductor-supporting substrate in the first-element-region first portion; and
  in the first-element-region first portion, forming a spacer film on each of a sidewall surface of the memory gate electrode and a sidewall surface of the select gate electrode, the sidewall surface of the memory gate electrode and the sidewall surface of the select gate electrode facing each other, and wherein the step of (c3) further includes, by the epitaxial growth method:
  forming the first raised portion on the surface of the semiconductor-supporting substrate exposed in the first-element-region second portion; and
  forming the second raised portion on the surface of the semiconductor-supporting substrate exposed in the first-element-region third portion.

9. The method according to claim 8,
wherein after the step of (c4), the step of forming each of the memory transistor and the select transistor further includes:
  (c9) removing the first insulating film covering the surface of the semiconductor-supporting substrate in the first-element-region first portion so as to expose the surface of the semiconductor-supporting substrate in the first-element-region first portion; and
  (c10) forming a first metal silicide film in each of the first raised portion, the second raised portion, the surface of the semiconductor-supporting substrate in the first-element-region first portion, the memory gate electrode and the select gate electrode.

10. The method according to claim 7,
wherein the step of (c2) further includes:
  by performing an etching process to each of the second insulating film and the first insulating film by using each of the memory gate electrode and the select gate electrode as an etching mask, exposing the surface of the semiconductor-supporting substrate in each of the first-element-region first portion, the first-element-region second portion and the first-element-region third portion; and
  forming a blocking film so as to cover the surface of the semiconductor-supporting substrate exposed in the first-element-region first portion, and wherein the step of (c3) further includes, by the epitaxial growth method:
  forming the first raised portion on the surface of the semiconductor-supporting substrate exposed in the first-element-region second portion; and
  forming the second raised portion on the surface of the semiconductor-supporting substrate exposed in the first-element-region third portion.

11. The method according to claim 10,
wherein after the step of (c4), the step of forming each of the memory transistor and the select transistor further includes:
  (c9) removing the first insulating film covering the surface of the semiconductor-supporting substrate in the first-element-region first portion so as to expose the surface of the semiconductor-supporting substrate in the first-element-region first portion; and
  (c10) forming a first metal silicide film in each of the first raised portion, the second raised portion, the surface of the semiconductor-supporting substrate in the first-element-region first portion, the memory gate electrode and the select gate electrode.

12. The method according to claim 6,
wherein the semiconductor substrate further includes:
  an insulating film formed on the semiconductor-supporting substrate; and
  a semiconductor layer formed on the insulating film,
wherein the step of (b) further includes a step of defining a second element region in the semiconductor layer, and
wherein the step of (c) further includes:
  forming a transistor, which is different from each of the memory transistor and the select transistor, in the second element region, the transistor having a gate electrode, a third-impurity-region first portion and a third-impurity-region second portion.

13. The method according to claim 12,
wherein the step of forming the transistor further includes:
  forming the gate electrode on a surface of the semiconductor layer located in the second element region via a gate insulating film;
  forming a third raised portion on the surface of the semiconductor layer located on one side in a gate length direction of the gate electrode with respect to the gate electrode, and forming a fourth raised portion on the surface of the semiconductor layer located on another side in the gate length direction of the gate electrode with respect to the gate electrode, each of the third raised portion and the fourth raised portion being formed from the surface of the semiconductor layer to a position higher than the surface of the semiconductor layer; and
  by implanting an another impurity into each of a surface of the third raised portion and a surface of the fourth raised portion, forming the third-impurity-region first portion in the third raised portion, and forming the third-impurity-region second portion in the fourth raised portion.

14. The method according to claim 13,
wherein the step of forming the transistor further includes:
  forming a second metal silicide film in each of the third raised portion, the fourth raised portion and the gate electrode.

15. The method according to claim 13,
wherein the step of forming each of the third raised portion and the fourth raised portion is performed at a same time as the step of forming each of the first raised portion and the second raised portion.

* * * * *